US009575668B1

(12) United States Patent
Martin

(10) Patent No.: US 9,575,668 B1
(45) Date of Patent: Feb. 21, 2017

(54) TECHNIQUES FOR SELECTING WRITE ENDURANCE CLASSIFICATION OF FLASH STORAGE BASED ON READ-WRITE MIXTURE OF I/O WORKLOAD

(71) Applicant: EMC Corporation, Hopkinton, MA (US)

(72) Inventor: Owen Martin, Hopedale, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 15/169,882

(22) Filed: Jun. 1, 2016

Related U.S. Application Data

(63) Continuation of application No. 14/319,040, filed on Jun. 30, 2014, now Pat. No. 9,378,136.

(51) Int. Cl.
*G06F 12/00* (2006.01)
*G06F 12/02* (2006.01)
*G06F 3/06* (2006.01)
*G11C 16/10* (2006.01)
*G11C 16/26* (2006.01)

(52) U.S. Cl.
CPC .......... *G06F 3/0611* (2013.01); *G06F 3/0647* (2013.01); *G06F 3/0659* (2013.01); *G06F 3/0688* (2013.01); *G11C 16/10* (2013.01); *G11C 16/26* (2013.01)

(58) Field of Classification Search
CPC ..................... G06F 12/0246; G06F 2212/7201
See application file for complete search history.

(56) References Cited

U.S. PATENT DOCUMENTS

| 7,949,637 | B1 * | 5/2011 | Burke | G06F 3/0605 |
| | | | | 707/655 |
| 2009/0070541 | A1 * | 3/2009 | Yochai | G06F 3/0605 |
| | | | | 711/165 |

* cited by examiner

*Primary Examiner* — Yong Choe
(74) *Attorney, Agent, or Firm* — Muirhead and Saturnelli, LLC

(57) ABSTRACT

Processing I/O operations is described. A write operation writes first data to a first location on a logical device having a logical address space partitioned into extents. The first location is included in a first subrange of the logical address space. Each extent includes logical address subranges of the logical address space. The first subrange is one of the logical address subranges of a first extent of the logical device. Physical storage is allocated from a first physical device of a first write endurance classification of flash memory-based storage devices. The first write endurance classification is selected in accordance with a ranking of multiple write endurance classifications. The physical storage is mapped to the first subrange. The first data is stored on the allocated physical storage. First workload information for the first write endurance classification for the first extent is updated to reflect the first write operation.

20 Claims, 20 Drawing Sheets

TECHNIQUES FOR SELECTING WRITE ENDURANCE CLASSIFICATION OF FLASH STORAGE BASED ON READ-WRITE MIXTURE OF I/O WORKLOAD

RELATED APPLICATIONS

This application is a continuation of U.S. application Ser. No. 14/319,040 filed Jun. 30, 2014 (pending), which is hereby incorporated by reference.

BACKGROUND

Technical Field

This application generally relates to data storage, and more particularly to techniques used in connection with selection of a type of physical storage medium for different types of I/O workloads.

Description of Related Art

Computer systems may include different resources used by one or more host processors. Resources and host processors in a computer system may be interconnected by one or more communication connections. These resources may include, for example, data storage devices such as those included in the data storage systems manufactured by EMC Corporation. These data storage systems may be coupled to one or more host processors and provide storage services to each host processor. Multiple data storage systems from one or more different vendors may be connected and may provide common data storage for one or more host processors in a computer system.

A host processor may perform a variety of data processing tasks and operations using the data storage system. For example, a host processor may perform basic system I/O operations in connection with data requests, such as data read and write operations.

Host processor systems may store and retrieve data using a storage device containing a plurality of host interface units, disk drives, and disk interface units. Such storage devices are provided, for example, by EMC Corporation of Hopkinton, Mass. The host systems access the storage device through a plurality of channels provided therewith. Host systems provide data and access control information through the channels to the storage device and storage device provides data to the host systems also through the channels. The host systems do not address the disk drives of the storage device directly, but rather, access what appears to the host systems as a plurality of logical disk units (LUNs), logical devices, or logical volumes (LVs). The logical disk units may or may not correspond to the actual disk drives. Allowing multiple host systems to access the single storage device unit allows the host systems to share data stored therein.

In connection with data storage, a variety of different technologies may be used. Data may be stored, for example, on different types of disk devices and/or flash memory devices. The data storage environment may define multiple storage tiers in which each tier includes physical devices or drives of varying technologies. The physical devices of a data storage system, such as a data storage array, may be used to store data for multiple applications.

SUMMARY OF THE INVENTION

In accordance with one aspect of the invention is a method of processing I/O operations comprising: receiving a first write operation to write first data to a first location on a logical device, wherein said logical device has a corresponding logical address space partitioned into a plurality of extents and said first location is included in a first subrange of the logical address space, each of said extents including a plurality of logical address subranges of the logical address space, a first of said plurality of extents including a first plurality of logical address subranges, said first subrange being one of the first plurality of logical address subranges of the first extent; allocating first physical storage from a first physical device of a first of a plurality of write endurance classifications of flash memory-based storage devices, wherein the first write endurance classification is selected in accordance with a ranking of said plurality of write endurance classifications; mapping the first physical storage to the first subrange; storing the first data on the first physical storage; and updating first workload information for the first write endurance classification for the first extent to reflect the first write operation, wherein said first workload information indicates mixture of read and write operations directed to logical addresses of the first extent mapped to physical storage of the first write endurance classification of flash memory-based storage devices. The method may include receiving a second write operation to write second data to the first subrange of the logical address space of the logical device; and determining, in accordance with a mixture of read and write operations indicated by the first workload information for the first extent associated with the first write endurance classification, whether the first write endurance classification is suitable for the first extent. The method may include responsive to determining that the first write endurance classification is suitable for the first extent, performing first processing including: updating the first workload information for the first extent including the first subrange to reflect the second write operation; and storing the second data to the first physical storage of the first device of the first write endurance classifications of flash memory-based storage devices. The method may include responsive to determining that the first write endurance classification is not suitable for the first extent, performing first processing including: selecting, in accordance with the first workload information indicating a mixture of read and write operations directed to logical addresses of the first extent mapped to physical storage of the first write endurance classification, a second of the plurality of write endurance classifications; allocating second physical storage from a second physical device of the second write endurance classifications of flash memory-based storage devices; mapping the second physical storage to the first subrange; storing the second data on the second physical storage; and updating second workload information for the first extent to reflect the second write operation, wherein said second workload information indicates a mixture of read and write operations directed to logical addresses of the first extent mapped to physical storage of the second write endurance classification. The method may include receiving, after the first write operation and prior to the second write operation, a plurality of read operations directed to one or more logical addresses of the first subrange of the first extent, wherein while said plurality of read operations are received, the first subrange is mapped to the first physical storage of the first physical device of the first write endurance classification; and updating the first workload information for the first extent to reflect the plurality of read operations. The plurality of write endurance classifications may be included in a ranking that ranks each of said plurality of write endurance classifications relative to others based on a relative write endurance of said each write endurance classification to the others, and wherein said first write endurance classification may be ranked in the ranking as having the highest write endurance of the plurality of write endurance classifications. The plurality of write endurance classifications may include any of single level cell (SLC) flash, enterprise multi-level cell (eMLC) flash, multi-level cell (MLC) flash, tri-level cell (TLC) flash, and consumer grade multi-level cell (cMLC). The logical device may be a virtually provisioned device where at least a portion of the logical address space of the logical device is not mapped to physical storage at a point in time. Physical storage may be allocated for each portion of the logical address space when a first write is performed to a location in said each portion. The method may include determining that the highest ranked of the plurality of write endurance classifications has an amount of unused capacity below a threshold amount; responsive to determining that the highest ranked of the plurality of write endurance classifications has an amount of unused capacity below a threshold amount, performing first processing including: determining an extent set of one or more extents of one or more logical devices to be relocated from the highest ranked write endurance classification, wherein each extent of the extent set is mapped to physical storage of the highest ranked write endurance classification and each extent of the extent set has workload information that indicates a mixture of read and write operations directed to logical addresses of said each extent mapped to physical storage of the highest write endurance classification, wherein the mixture is unsuitable for the highest ranked write endurance classification; for each extent of the extent set, selecting a target write endurance classification in accordance with the workload information indicating a mixture of read and write operations directed to logical addresses of said each extent mapped to physical storage of the highest ranked write endurance classification; and for each extent of the extent set, relocating one or more data portions to a second write endurance classification, each of said one or more data portions for said each extent being stored at one or more logical addresses of said each extent, wherein said second write endurance classification is selected in accordance with a mixture of read and write operations indicated by the workload information for said each extent associated with the highest write endurance classification, said relocating including mapping logical addresses of each of said one or more data portions of said each extent to physical storage allocated from the second write endurance classification. Processing may be performed that relocates second data from one of the plurality of write endurance classifications to another of the plurality of write endurance classifications, wherein the one write endurance classification may be determined as unsuitable for storing the second data that is relocated and the another write endurance classification may be determined as being suitable for storing the second data based on a mixture of read and write operations directed to the second data stored on the one write endurance classification.

In accordance with another aspect of the invention is a data storage system comprising: a processor; a plurality of physical storage devices, wherein each of the plurality of physical storage devices is included in one of a plurality of write endurance classifications of flash memory-based storage devices; a memory comprising code that, when executed, performs a method comprising: receiving a first write operation to write first data to a first location on a logical device, wherein said logical device has a corresponding logical address space partitioned into a plurality of subranges and said first location is included in a first subrange of the logical address space; allocating first physical storage from a first of the plurality of physical devices, wherein said first physical storage device is included in a first of the plurality of write endurance classifications of flash memory-based storage devices, wherein the first write endurance classification is selected in accordance with a ranking of said plurality of write endurance classifications; mapping the first physical storage to at least a portion of the first subrange; storing the first data on the first physical storage; and updating first workload information for the first write endurance classification for the first subrange to reflect the first write operation, wherein said first workload information indicates a mixture of read and write operations directed to logical addresses of the first subrange mapped to physical storage of the first write endurance classification of flash memory-based storage devices.

In accordance aspect of the invention is a non-transitory computer readable medium comprising code stored thereon that, when executed, performs a method for processing I/O operations, the method comprising: receiving a first write operation to write first data to a first location on a logical device, wherein said logical device has a corresponding logical address space partitioned into a plurality of extents and said first location is included in a first subrange of the logical address space, each of said extents including a plurality of logical address subranges of the logical address space, a first of said plurality of extents including a first plurality of logical address subranges, said first subrange being one of the first plurality of logical address subranges of the first extent; allocating first physical storage from a first physical device of a first of a plurality of write endurance classifications of flash memory-based storage devices, wherein the first write endurance classification is selected in accordance with a ranking of said plurality of write endurance classifications; mapping the first physical storage to the first subrange; storing the first data on the first physical storage; and updating first workload information for the first write endurance classification for the first extent to reflect the first write operation, wherein said first workload information indicates mixture of read and write operations directed to logical addresses of the first extent mapped to physical storage of the first write endurance classification of flash memory-based storage devices. The method may include receiving a second write operation to write second data to the first subrange of the logical address space of the logical device; and determining, in accordance with a mixture of read and write operations indicated by the first workload information for the first extent associated with the first write endurance classification, whether the first write endurance classification is suitable for the first extent. The method may include responsive to determining that the first write endurance classification is suitable for the first extent, performing first processing including: updating the first workload information for the first extent including the first subrange to reflect the second write operation; and storing the second data to the first physical storage of the first device of the first write endurance classifications of flash memory-based storage devices. The method may include responsive to determining that the first write endurance classification is not suitable for the first extent, performing first processing including: selecting, in accordance with the first workload information indicating a mixture of read and write operations directed to logical addresses of the first extent mapped to physical storage of the first write endurance classification, a second of the plurality of write endurance classifications; allocating second physical storage from a second physical device of the second write endurance classifications of flash memory-based storage devices; mapping the second physical storage to the first subrange; storing the second data on the second physical storage; and updating second workload information for the first extent to reflect the second write operation, wherein said second workload information indicates a mixture of read and write operations directed to logical addresses of the first extent mapped to physical storage of the second write endurance classification. The method may include receiving, after the first write operation and prior to the second write operation, a plurality of read operations directed to one or more logical addresses of the first subrange of the first extent, wherein while said plurality of read operations are received, the first subrange is mapped to the first physical storage of the first physical device of the first write endurance classification; and updating the first workload information for the first extent to reflect the plurality of read operations. The plurality of write endurance classifications may be included in a ranking that ranks each of said plurality of write endurance classifications relative to others based on a relative write endurance of said each write endurance classification to the others, and wherein said first write endurance classification may be ranked in the ranking as having the highest write endurance of the plurality of write endurance classifications. The plurality of write endurance classifications may include any of single level cell (SLC) flash, enterprise multi-level cell (eMLC) flash, multi-level cell (MLC) flash, tri-level cell (TLC) flash, and consumer grade multi-level cell (cMLC). The logical device may be a virtually provisioned device where at least a portion of the logical address space of the logical device may not be mapped to physical storage at a point in time.

BRIEF DESCRIPTION OF THE DRAWINGS

Features and advantages of the present invention will become more apparent from the following detailed description of exemplary embodiments thereof taken in conjunction with the accompanying drawings in which.

DETAILED DESCRIPTION OF EMBODIMENT(S)

Figure 1:
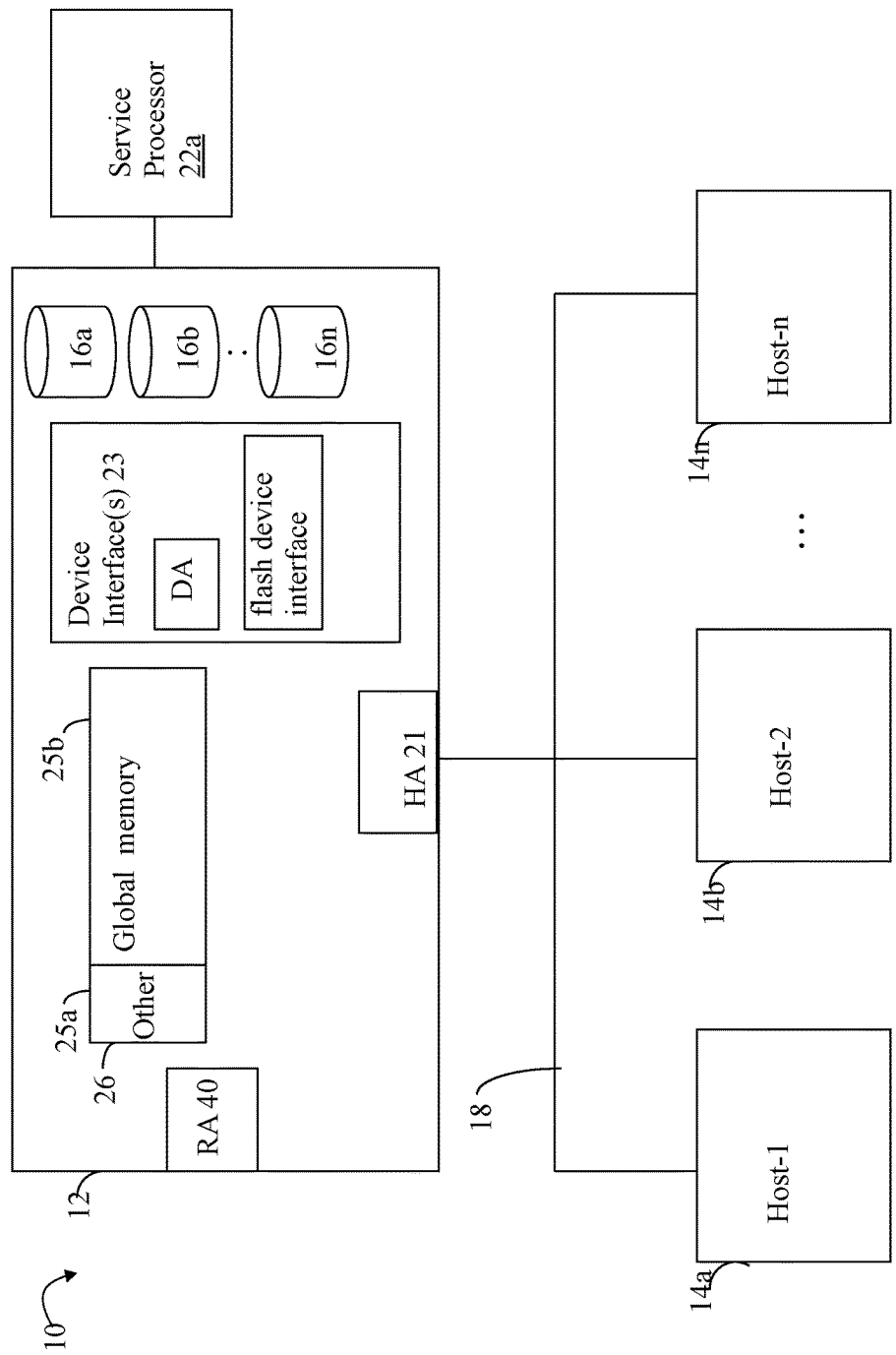
FIG. 1 is an example of an embodiment of a system that may utilize the techniques described herein.

Referring to FIG. 1, shown is an example of an embodiment of a system that may be used in connection with performing the techniques described herein. The system 10 includes a data storage system 12 connected to host systems 14a-14n through communication medium 18. In this embodiment of the computer system 10, and the n hosts 14a-14n may access the data storage system 12, for example, in performing input/output (I/O) operations or data requests. The communication medium 18 may be any one or more of a variety of networks or other type of communication connections as known to those skilled in the art. The communication medium 18 may be a network connection, bus, and/or other type of data link, such as a hardwire or other connections known in the art. For example, the communication medium 18 may be the Internet, an intranet, network (including a Storage Area Network (SAN)) or other wireless or other hardwired connection(s) by which the host systems 14a-14n may access and communicate with the data storage system 12, and may also communicate with other components included in the system 10.

Each of the host systems 14a-14n and the data storage system 12 included in the system 10 may be connected to the communication medium 18 by any one of a variety of connections as may be provided and supported in accordance with the type of communication medium 18. The processors included in the host computer systems 14a-14n may be any one of a variety of proprietary or commercially available single or multi-processor system, such as an Intel-based processor, or other type of commercially available processor able to support traffic in accordance with each particular embodiment and application.

It should be noted that the particular examples of the hardware and software that may be included in the data storage system 12 are described herein in more detail, and may vary with each particular embodiment. Each of the host computers 14a-14n and data storage system may all be located at the same physical site, or, alternatively, may also be located in different physical locations. Examples of the communication medium that may be used to provide the different types of connections between the host computer systems and the data storage system of the system 10 may use a variety of different communication protocols such as SCSI, Fibre Channel, iSCSI, and the like. Some or all of the connections by which the hosts and data storage system may be connected to the communication medium may pass through other communication devices, such switching equipment that may exist such as a phone line, a repeater, a multiplexer or even a satellite.

Each of the host computer systems may perform different types of data operations in accordance with different types of tasks. In the embodiment of FIG. 1, any one of the host computers 14a-14n may issue a data request to the data storage system 12 to perform a data operation. For example, an application executing on one of the host computers 14a-14n may perform a read or write operation resulting in one or more data requests to the data storage system 12.

It should be noted that although element 12 is illustrated as a single data storage system, such as a single data storage array, element 12 may also represent, for example, multiple data storage arrays alone, or in combination with, other data storage devices, systems, appliances, and/or components having suitable connectivity, such as in a SAN, in an embodiment using the techniques herein. It should also be noted that an embodiment may include data storage arrays or other components from one or more vendors. In subsequent examples illustrated the techniques herein, reference may be made to a single data storage array by a vendor, such as by EMC Corporation of Hopkinton, Mass. However, as will be appreciated by those skilled in the art, the techniques herein are applicable for use with other data storage arrays by other vendors and with other components than as described herein for purposes of example.

The data storage system 12 may be a data storage array including a plurality of data storage devices 16a-16n. The data storage devices 16a-16n may include one or more types of data storage devices such as, for example, one or more disk drives and/or one or more solid state drives (SSDs). An SSD is a data storage device that uses solid-state memory to store persistent data. An SSD using SRAM or DRAM, rather than flash memory, may also be referred to as a RAM drive. SSD may refer to solid state electronics devices as distinguished from electromechanical devices, such as hard drives, having moving parts. Flash devices or flash memory-based SSDs are one type of SSD that contains no moving parts. As described in more detail in following paragraphs, the techniques herein may be used in an embodiment in which one or more of the devices 16a-16n are flash drives or devices. More generally, the techniques herein may also be used with any type of SSD although following paragraphs may make reference to a particular type such as a flash device or flash memory device.

The data storage array may also include different types of adapters or directors, such as an HA 21 (host adapter), RA 40 (remote adapter), and/or device interface 23. Each of the adapters may be implemented using hardware including a processor with local memory with code stored thereon for execution in connection with performing different operations. The HAs may be used to manage communications and data operations between one or more host systems and the global memory (GM). In an embodiment, the HA may be a Fibre Channel Adapter (FA) or other adapter which facilitates host communication. The HA 21 may be characterized as a front end component of the data storage system which receives a request from the host. The data storage array may include one or more RAs that may be used, for example, to facilitate communications between data storage arrays. The data storage array may also include one or more device interfaces 23 for facilitating data transfers to/from the data storage devices 16a-16n. The data storage interfaces 23 may include device interface modules, for example, one or more disk adapters (DAs) (e.g., disk controllers), adapters used to interface with the flash drives, and the like. The DAs may also be characterized as back end components of the data storage system which interface with the physical data storage devices.

One or more internal logical communication paths may exist between the device interfaces 23, the RAs 40, the HAs 21, and the memory 26. An embodiment, for example, may use one or more internal busses and/or communication modules. For example, the global memory portion 25b may be used to facilitate data transfers and other communications between the device interfaces, HAs and/or RAs in a data storage array. In one embodiment, the device interfaces 23 may perform data operations using a cache that may be included in the global memory 25b, for example, when communicating with other device interfaces and other components of the data storage array. The other portion 25a is that portion of memory that may be used in connection with other designations that may vary in accordance with each embodiment.

The particular data storage system as described in this embodiment, or a particular device thereof, such as a disk or particular aspects of a flash device, should not be construed as a limitation. Other types of commercially available data storage systems, as well as processors and hardware controlling access to these particular devices, may also be included in an embodiment.

Host systems provide data and access control information through channels to the storage systems, and the storage systems may also provide data to the host systems also through the channels. The host systems do not address the drives or devices 16a-16n of the storage systems directly, but rather access to data may be provided to one or more host systems from what the host systems view as a plurality of logical devices or logical volumes. Description herein may use the abbreviation LV or LUN to generally denote a logical unit or volume of storage on the data storage system. The LUNs may or may not correspond to the actual physical devices or drives 16a-16n. For example, one or more LUNs may reside on a single physical drive or multiple drives. Data in a single data storage system, such as a single data storage array, may be accessed by multiple hosts allowing the hosts to share the data residing therein. The HAs may be used in connection with communications between a data storage array and a host system. The RAs may be used in facilitating communications between two data storage arrays. The DAs may be one type of device interface used in connection with facilitating data transfers to/from the associated disk drive(s) and LUN(s) residing thereon. A flash device interface may be another type of device interface used in connection with facilitating data transfers to/from the associated flash devices and LUN(s) residing thereon. It should be noted that an embodiment may use the same or a different device interface for one or more different types of devices than as described herein.

The device interface, such as a DA, performs I/O operations on a drive 16a-16n. In the following description, data residing on a LUN may be accessed by the device interface following a data request in connection with I/O operations that other directors originate. Data may be accessed by LUN in which a single device interface manages data requests in connection with the different one or more LUNs that may reside on a drive 16a-16n.

Also shown in FIG. 1 is a service processor 22a that may be used to manage and monitor the system 12. In one embodiment, the service processor 22a may be used in collecting performance data, for example, regarding the I/O performance in connection with data storage system 12. This performance data may relate to, for example, performance measurements in connection with a data request as may be made from the different host computer systems 14a 14n. This performance data may be gathered and stored in a storage area. Additional detail regarding the service processor 22a is described in following paragraphs.

It should be noted that a service processor 22*a* may exist external to the data storage system 12 (such as in embodiments where the service processor 22*a* is included in a component or system separate from the data storage system) and may communicate with the data storage system 12 using any one of a variety of communication connections. In one embodiment, the service processor 22*a* may communicate with the data storage system 12 through three different connections, a serial port, a parallel port and using a network interface card, for example, with an Ethernet connection. Using the Ethernet connection, for example, a service processor may communicate directly with DAs and HAs within the data storage system 12. In some embodiments, the service processor 22*a* may be included in a component internal within the data storage system.

Figure 2:
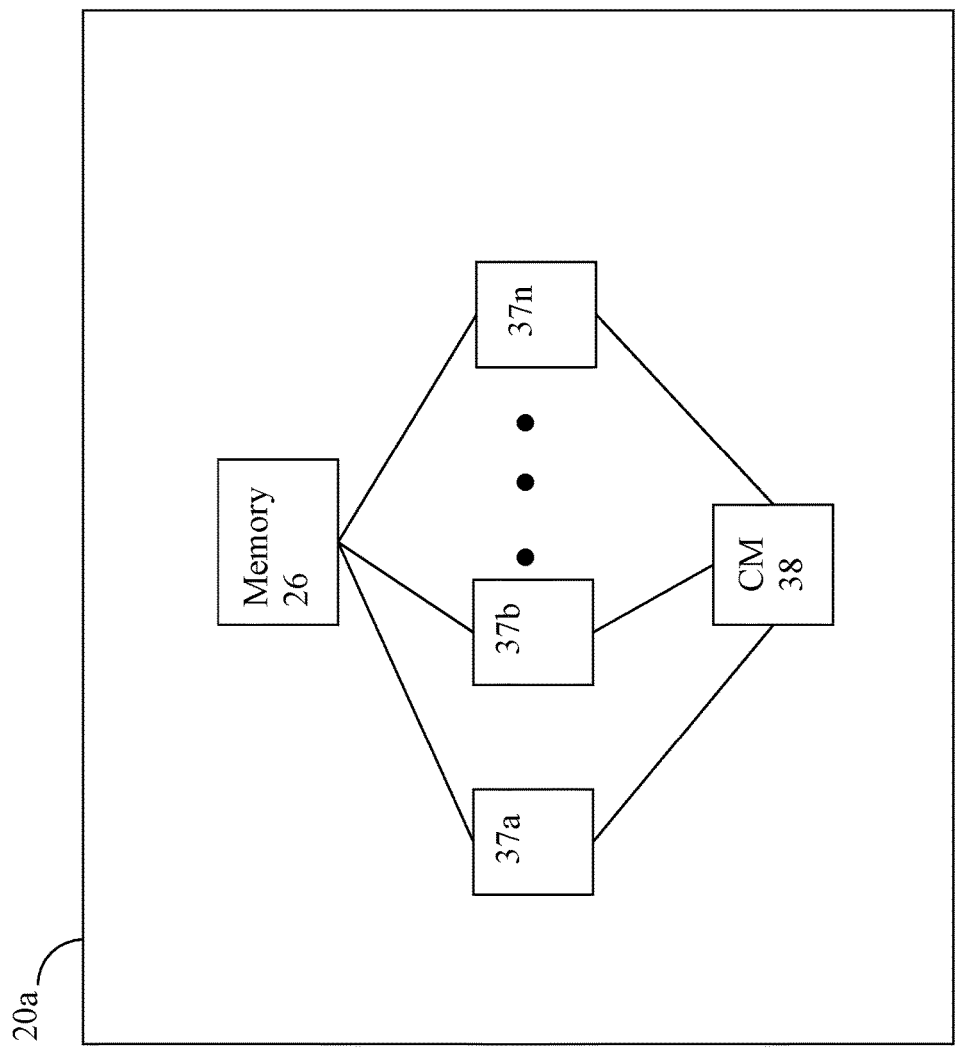
FIG. 2 is a representation of the logical internal communications between the directors and memory included in one embodiment of a data storage system of FIG. 1.

Referring to FIG. 2, shown is a representation of the logical internal communications between the directors and memory included in a data storage system. Included in FIG. 2 is a plurality of directors 37*a*-37*n* coupled to the memory 26. Each of the directors 37*a*-37*n* represents one of the HAs, RAs, or device interfaces that may be included in a data storage system. In an embodiment disclosed herein, there may be up to sixteen directors coupled to the memory 26. Other embodiments may allow a maximum number of directors other than sixteen as just described and the maximum number may vary with embodiment.

The representation of FIG. 2 also includes an optional communication module (CM) 38 that provides an alternative communication path between the directors 37*a*-37*n*. Each of the directors 37*a*-37*n* may be coupled to the CM 38 so that any one of the directors 37*a*-37*n* may send a message and/or data to any other one of the directors 37*a*-37*n* without needing to go through the memory 26. The CM 38 may be implemented using conventional MUX/router technology where a sending one of the directors 37*a*-37*n* provides an appropriate address to cause a message and/or data to be received by an intended receiving one of the directors 37*a*-37*n*. In addition, a sending one of the directors 37*a*-37*n* may be able to broadcast a message to all of the other directors 37*a*-37*n* at the same time.

With reference back to FIG. 1, components of the data storage system may communicate using GM 25*b*. For example, in connection with a write operation, an embodiment may first store the data in system data cache such as included in a portion of GM 25*b*, mark the cache slot including the write operation data as write pending (WP), and then later destage the WP data from cache to one of the devices 16*a*-16*n*. In connection with returning data to a host from one of the devices as part of a read operation, the data may be copied from the device by the appropriate device interface, such as a DA servicing the device. The device interface may copy the data read into a cache slot included in GM which is, in turn, communicated to the appropriate HA in communication with the host.

As described above, the data storage system 12 may be a data storage array including a plurality of data storage devices 16*a*-16*n* in which one or more of the devices 16*a*-16*n* are flash memory devices employing one or more different flash memory technologies. In one embodiment, the data storage system 12 may be a Symmetrix® DMX™ or VMAX™ data storage array by EMC Corporation of Hopkinton, Mass. In the foregoing data storage array, the data storage devices 16*a*-16*n* may include a combination of disk devices and flash devices in which the flash devices may appear as standard Fibre Channel (FC) drives to the various software tools used in connection with the data storage array. The flash devices may be constructed using nonvolatile semiconductor NAND flash memory. The flash devices may include, for example, one or more SLC (single level cell) devices and/or MLC (multi level cell) devices.

It should be noted that the techniques herein may be used in connection with flash devices comprising what may be characterized as enterprise-grade or enterprise-class flash drives (EFDs) with an expected lifetime (e.g., as measured in an amount of actual elapsed time such as a number of years, months, and/or days) based on a number of guaranteed write cycles, or program cycles, and a rate or frequency at which the writes are performed. Thus, a flash device may be expected to have a usage or lifetime measured in calendar or wall clock elapsed time based on the amount of time it takes to perform the number of guaranteed write cycles. The techniques herein may also be used with other flash devices, more generally referred to as non-enterprise class flash devices, which, when performing writes at a same rate as for enterprise class drives, may have a lower expected lifetime based on a lower number of guaranteed write cycles. Thus, as described in more detail elsewhere herein, to guarantee a same lifetime of use for different types of flash-based physical storage devices, such as SLC and MLC, a different number of allowable writes per day may be specified for each type of flash-based physical storage device based on the write endurance variation of each type.

The techniques herein may be generally used in connection with any type of flash device, or more generally, any SSD technology. The flash device may be, for example, a flash device which is a NAND gate flash device, NOR gate flash device, flash device that uses SLC or MLC technology, and the like, as known in the art. In one embodiment, the one or more flash devices may include MLC flash memory devices although an embodiment may utilize MLC, alone or in combination with, other types of flash memory devices or other suitable memory and data storage technologies. More generally, the techniques herein may be used in connection with other SSD technologies although particular flash memory technologies may be described herein for purposes of illustration.

An embodiment in accordance with techniques herein may have one or more defined storage tiers. Each tier may generally include physical storage devices or drives having one or more attributes associated with a definition for that tier. For example, one embodiment may provide a tier definition based on a set of one or more attributes. The attributes may include any one or more of a storage type or storage technology, a type of data protection, device performance characteristic(s), storage capacity, and the like. The storage type or technology may specify whether a physical storage device is an SSD drive (such as a flash drive), a particular type of SSD drive (such using flash or a form of RAM), a type of magnetic disk or other non-SSD drive (such as an FC disk drive, a SATA (Serial Advanced Technology Attachment) drive), and the like. Data protection may specify a type or level of data storage protection such, for example, as a particular RAID level (e.g., RAID1, RAID-5 3+1, RAIDS 7+1, and the like). Performance characteristics may relate to different performance aspects of the physical storage devices of a particular type or technology. For example, there may be multiple types of FC disk drives based on the RPM characteristics of the FC disk drives (e.g., 10K RPM FC drives and 15K RPM FC drives) and FC disk drives having different RPM characteristics may be included in different storage tiers. Storage capacity may specify the amount of data, such as in bytes, that may be stored on the drives. An embodiment may allow a user to define one or more such storage tiers. For example, an embodiment in accordance with techniques herein may define two storage tiers including a first tier of all SSD drives and a second tier of all non-SSD drives. In some embodiments, the first tier of SSD drives may include multiple types of flash memory-based storage devices, such as SLC and MLC. More generally, as described elsewhere herein, the different types of flash memory-based storage devices may also be referred to as write endurance classifications whereby a single SSD tier may include physical storage devices of one or more write endurance classifications of flash memory-based storage devices. Generally, as set forth in more detail in following paragraphs, an embodiment in accordance with techniques herein may use flash memory-based storage devices of multiple different types of flash drives, or multiple write endurance classifications. Different types of flash drives, such as SLC and MLC, have different write endurance. As known in the art, flash-based media experiences wear out based on the number of writes performed. Within a lifetime or usage period, the amount of writes that each type of flash, such as MLC or SLC, may be expected to successfully sustain varies. For example, with SLC, stored one bit of information or data per cell and may be the simplest of all flash types. Due to having only one bit per cell, it may therefore have the longest lasting of the flash types in an embodiment in accordance with techniques herein. In contrast, for example, with MLC, multiple bits of information are stored per cell and wear rate during write operations is greater than with SLC. Thus, during a usage or lifetime period, an SLC device is expected to be able to have a larger number of allowable writes than an MLC device. In this manner, the SLC device may be characterized as a type of flash having a higher write endurance than the MLC device. Furthermore, the SLC device may be generally included in first write endurance classification associated with a first level of write endurance and the MLC device may be generally included in a second write endurance classification associated with a second different level of write endurance. Additional flash types and associated write endurance classifications are described in more detail below.

Figure 3:
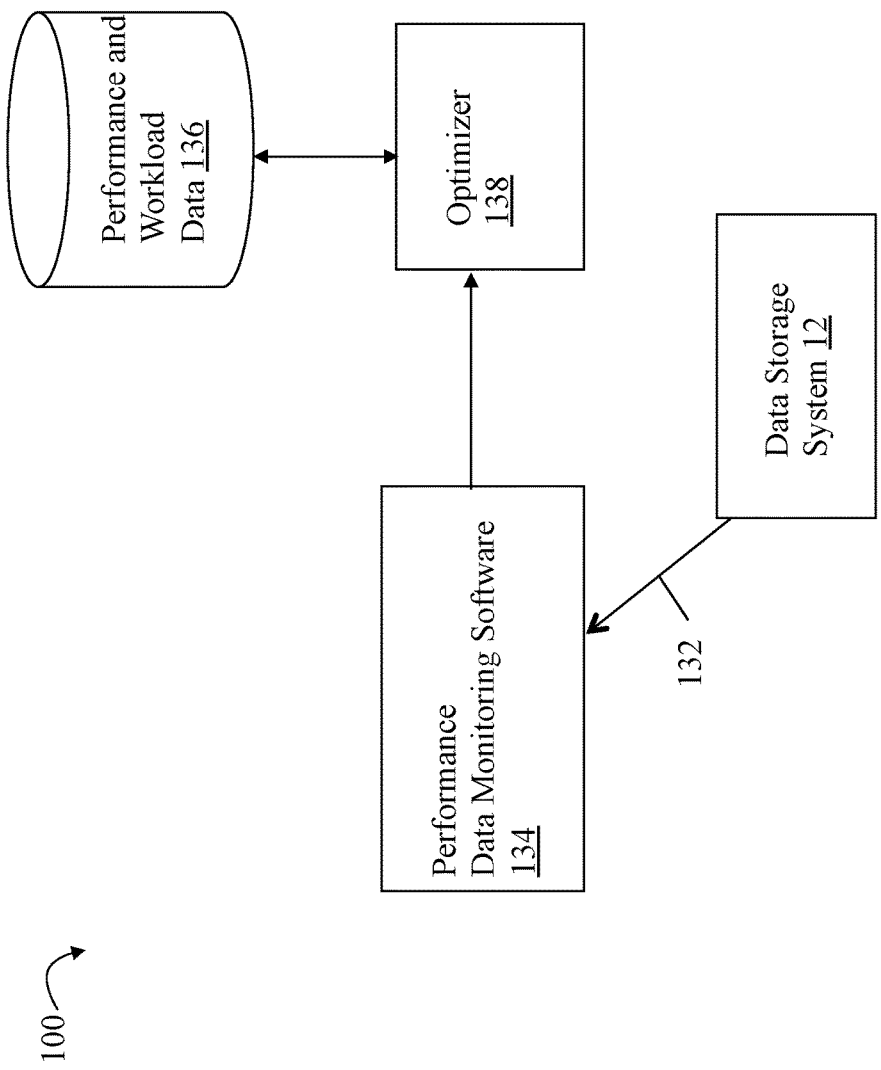
FIG. 3 is an example representing components that may be included in a service processor in an embodiment in accordance with techniques herein.

Referring to FIG. 3, shown is an example 100 of software that may be included in a service processor such as 22a. It should be noted that the service processor may be any one of a variety of commercially available processors, such as an Intel-based processor, and the like. Although what is described herein shows details of software that may reside in the service processor 22a, all or portions of the illustrated components may also reside elsewhere such as, for example, on any of the host systems 14a 14n.

Included in the service processor 22a is performance data monitoring software 134 which gathers performance and workload data about the data storage system 12 through the connection 132. The performance data monitoring software 134 gathers and stores performance and workload data and forwards this to the optimizer 138 which further stores the data in the performance and workload data file 136. This performance and workload data 136 may also serve as an input to the optimizer 138 which attempts to enhance the performance of I/O operations, such as those I/O operations associated with data storage devices 16a-16n of the system 12. The optimizer 138 may take into consideration various types of parameters and performance data 136 in an attempt to optimize particular metrics associated with performance of the data storage system 12. The performance and workload data 136 may be used by the optimizer to determine metrics described and used in connection with techniques herein. The optimizer may access the performance data, for example, collected for a plurality of LUNs when performing a data storage optimization. The performance and workload data 136 may be used in determining a workload for one or more physical devices, logical devices or volumes serving as data devices, thin devices (described in more detail elsewhere herein) or other virtually provisioned devices, portions of thin devices, and the like. The workload may also be a measurement or level of "how busy" a device is, for example, in terms of I/O operations (e.g., I/O throughput such as number of I/Os/second, response time (RT), and the like).

It should be noted that the operations of read and write with respect to a logical device, such as a thick or standard logical device such as a LUN, thin device, and the like, may be viewed as read and write requests or commands from the DA 23, controller or other backend physical device interface. Thus, these are operations may also be characterized as a number of operations with respect to the physical storage device (e.g., number of physical device reads, writes, and the like, based on physical device accesses). This is in contrast to observing or counting a number of particular type of I/O requests (e.g., reads or writes) as issued from the host and received by a front end component such as an HA 21. To illustrate, a host read request may not result in a read request or command issued to the DA if there is a cache hit and the requested data is in cache. The host read request results in a read request or command issued to the DA 23 to retrieve data from the physical drive only if there is a read miss. Furthermore, when writing data of a received host I/O request to the physical device, the host write request may result in multiple reads and/or writes by the DA 23 in addition to writing out the host or user data of the request. For example, if the data storage system implements a RAID data protection technique, such as RAID-5, additional reads and writes may be performed such as in connection with writing out additional parity information for the user data. Thus, observed data gathered to determine workload, such as observed numbers of reads and writes, may refer to the read and write requests or commands performed by the DA. Such read and write commands may correspond, respectively, to physical device accesses such as disk reads and writes that may result from a host I/O request received by an HA 21.

The optimizer 138 may be a data storage optimizer perform processing of the techniques herein set forth in following paragraphs, alone or in combination with, other optimizations. For example, the optimizer 138 may determine how to allocate or partition physical storage in a multi-tiered environment for use by multiple applications. The optimizer 138 may also perform other processing such as, for example, to determine what particular portions of thin devices to store on physical devices of a particular tier, evaluate when to move data between physical drives of different tiers, and the like. It should be noted that the optimizer 138 may generally represent one or more components that perform processing as described herein as well as one or more other optimizations and other processing that may be performed in an embodiment. In at least one embodiment, such techniques described herein may be performed by the optimizer 138 or more generally one or more software modules of code that, when executed, perform the processing described herein. Additionally, such techniques described herein may be performed in a multi-tiered storage environment including a tier of flash memory-based storage devices of multiple types of write endurance classifications. Techniques herein may also be performed in an embodiment which only includes a single tier of flash memory-based storage devices of multiple types of write endurance classifications.

Described in following paragraphs are techniques that may be performed to determine what data portions, such as of logical devices like thin devices, to store on physical devices of a particular write endurance classification of a flash memory-based storage devices. Such data portions of a thin device may be automatically placed in a particular write endurance classification where the techniques herein have determined that the particular write endurance classification is suitable to service I/Os directed to such data portions in accordance with criteria described herein. The data portions may also be automatically relocated or moved to a different write endurance classifications as the work load and observed performance characteristics for the data portions change over time. In accordance with techniques herein, analysis of I/O workload for data portions of thin devices may be performed in order to determine whether particular data portions should have their data contents stored on physical devices located in a particular write endurance classification. The techniques herein may take into account the read-write mixture of the I/O workload directed to the data portion currently stored in a particular write endurance classification in order to evaluate whether that particular write endurance classification is suitable for the data portion or whether the data portion should be relocated to a different write endurance classification more suitable for the current read-write mixture.

Since flash drives are generally well suited for high throughput of I/Os/sec/GB, processing may be performed to determine which of the devices, and portions thereof, are characterized as most I/O intensive and therefore may be good candidates to have their data stored on flash drives. However, there may be multiple different types or multiple different write endurance classifications of flash memory-based where different write endurance classifications are preferred or more suitable for I/O workloads of different read-write mixtures. Thus, techniques are described herein for selecting a write endurance classification of flash memory-based storage for a data portion based on the read-write mixture of an I/O workload observed for the data portion such as a thin or virtually provisioned logical device. However, prior to describing such techniques, following paragraphs set forth a description of other aspects of a data storage system in an embodiment in accordance with techniques herein.

Figure 4:
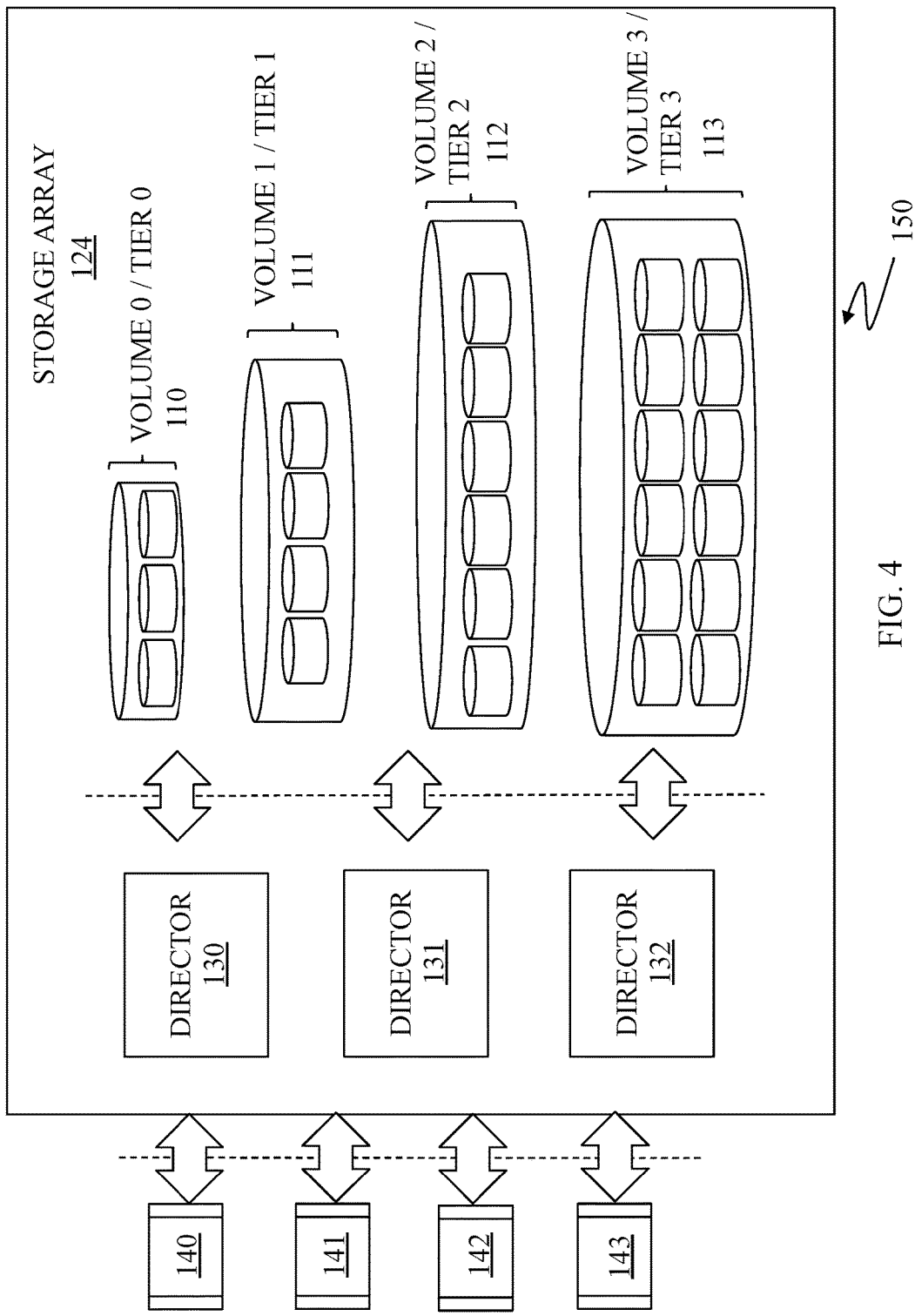
FIGS. 4, 5A and 5B are examples illustrating a data storage system, such as data storage array, including a plurality of storage tiers in an embodiment in accordance with techniques herein.

FIG. 4 is a schematic illustration showing a storage system 150 that may be used in connection with an embodiment of the system described herein. The storage system 150 may include a storage array 124 having multiple directors 130-132 and multiple storage volumes (LVs, logical devices or VOLUMES 0-3) 110-113. Host applications 140-144 and/or other entities (e.g., other storage devices, SAN switches, etc.) request data writes and data reads to and from the storage array 124 that are facilitated using one or more of the directors 130-132. The storage array 124 may include similar features as that discussed above.

The volumes 110-113 may be provided in multiple storage tiers (TIERS 0-3) that may have different storage characteristics, such as speed, cost, reliability, availability, security and/or other characteristics. As described above, a tier may represent a set of storage resources, such as physical storage devices, residing in a storage platform. Examples of storage disks that may be used as storage resources within a storage array of a tier may include sets SATA disks, FC disks, flash memory-based storage devices of multiple write endurance classifications, and the like.

According to various embodiments, each of the volumes 110-113 may be located in different storage tiers. Tiered storage provides that data may be initially allocated to a particular fast volume/tier, but a portion of the data that has not been used over a period of time (for example, three weeks) may be automatically moved to a slower (and perhaps less expensive) tier. For example, data that is expected to be used frequently, for example database indices, may be initially written directly to fast storage whereas data that is not expected to be accessed frequently, for example backup or archived data, may be initially written to slower storage. In an embodiment, the system described herein may be used in connection with a Fully Automated Storage Tiering (FAST) product produced by EMC Corporation of Hopkinton, Mass., that provides for the optimization of the use of different storage tiers including the ability to easily create and apply tiering policies (e.g., allocation policies, data movement policies including promotion and demotion thresholds, and the like) to transparently automate the control, placement, and movement of data within a storage system based on business needs. The techniques herein may be used to determine amounts or allocations of each storage tier used by each application based on capacity limits in combination with performance limits.

Figure 5A:
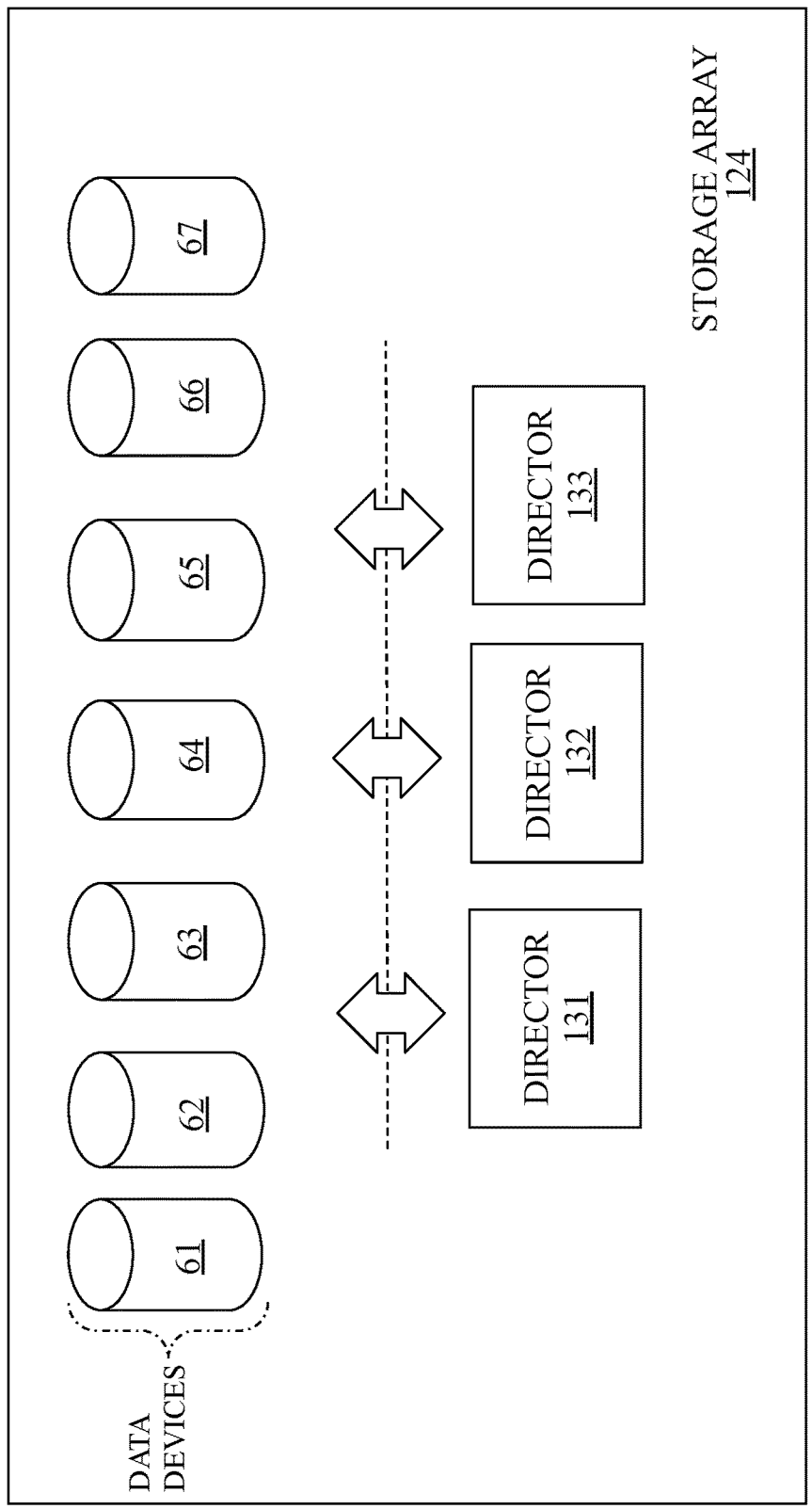

Referring to FIG. 5A, shown is a schematic diagram of the storage array 124 as including a plurality of data devices 61-67 communicating with directors 131-133. The data devices 61-67 may be implemented as logical devices like standard logical devices (also referred to as thick devices) provided in a Symmetrix® data storage system produced by EMC Corporation of Hopkinton, Mass., for example. In some embodiments, the data devices 61-67 may not be directly useable (visible) to hosts (e.g., such as LUNs) coupled to the storage array 124. Each of the data devices 61-67 may correspond to a portion (including a whole portion) of one or more of the disk drives 42-44 (or more generally physical devices). Thus, for example, the data device section 61 may correspond to the disk drive 42, may correspond to a portion of the disk drive 42, or may correspond to a portion of the disk drive 42 and a portion of the disk drive 43. The data devices 61-67 may be designated as corresponding to different classes, so that different ones of the data devices 61-67 correspond to different physical storage having different relative access speeds or RAID protection type (or some other relevant distinguishing characteristic or combination of characteristics), as further discussed elsewhere herein. Alternatively, in other embodiments that may be used in connection with the system described herein, instead of being separate devices, the data devices 61-67 may be sections of one data device.

Figure 5B:
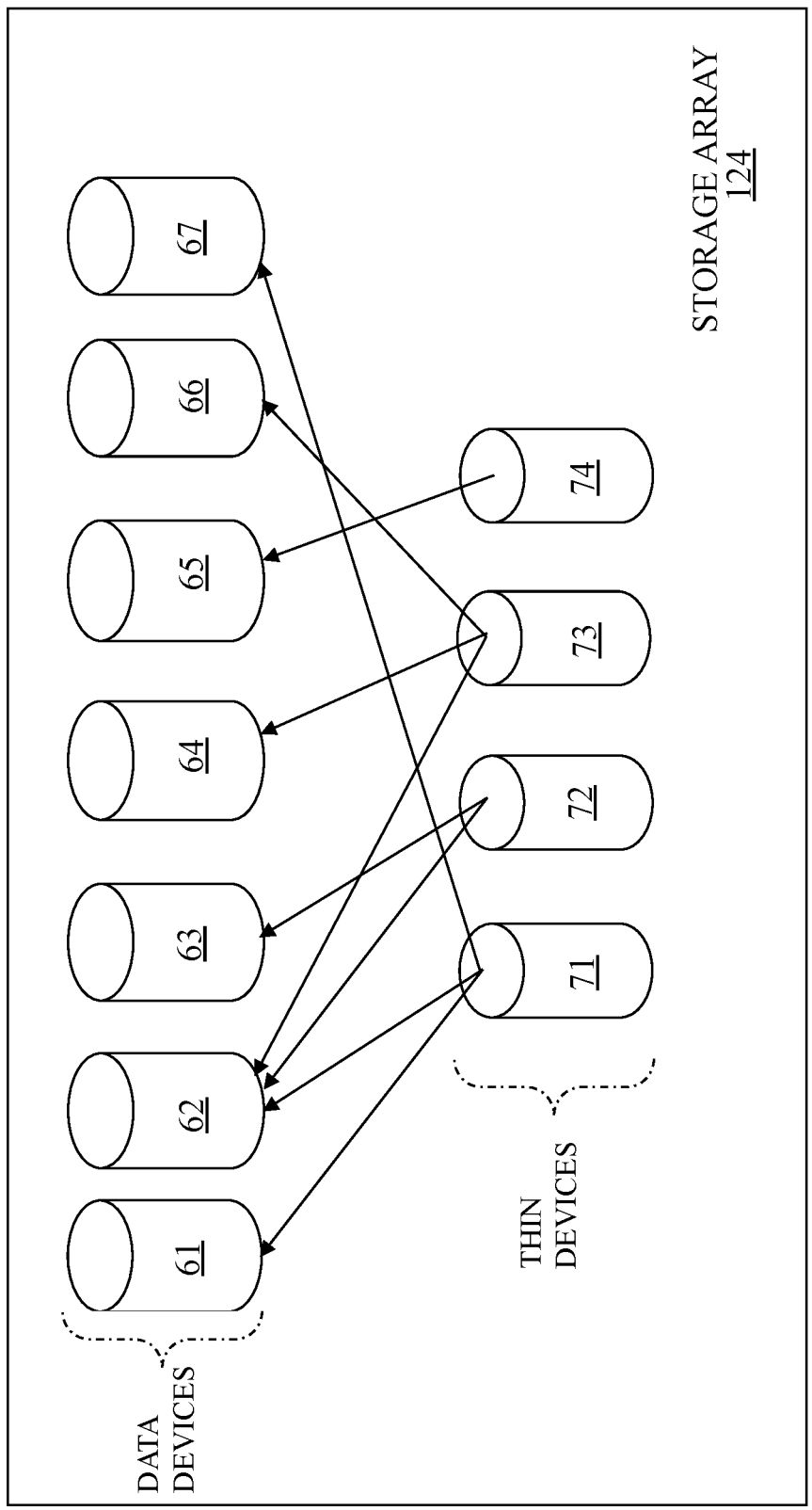

As shown in FIG. 5B, the storage array 124 may also include a plurality of thin devices or virtually provisioned devices 71-74 that may be adapted for use in connection with the system described herein when using thin or virtual provisioning. In a system using thin provisioning, the thin devices 71-74 may appear to a host coupled to the storage array 124 as one or more logical volumes (logical devices) containing contiguous blocks of data storage. Each of the thin devices 71-74 may contain pointers to some or all of the data devices 61-67 (or portions thereof). As described in more detail elsewhere herein, a thin device may be virtually provisioned in terms of its allocated physical storage in physical storage for a thin device presented to a host as having a particular capacity is allocated as needed rather than allocate physical storage for the entire thin device capacity upon creation of the thin device. As such, a thin device presented to the host as having a capacity with a corresponding LBA (logical block address) range may have portions of the LBA range for which storage is not allocated.

Figure 5C:
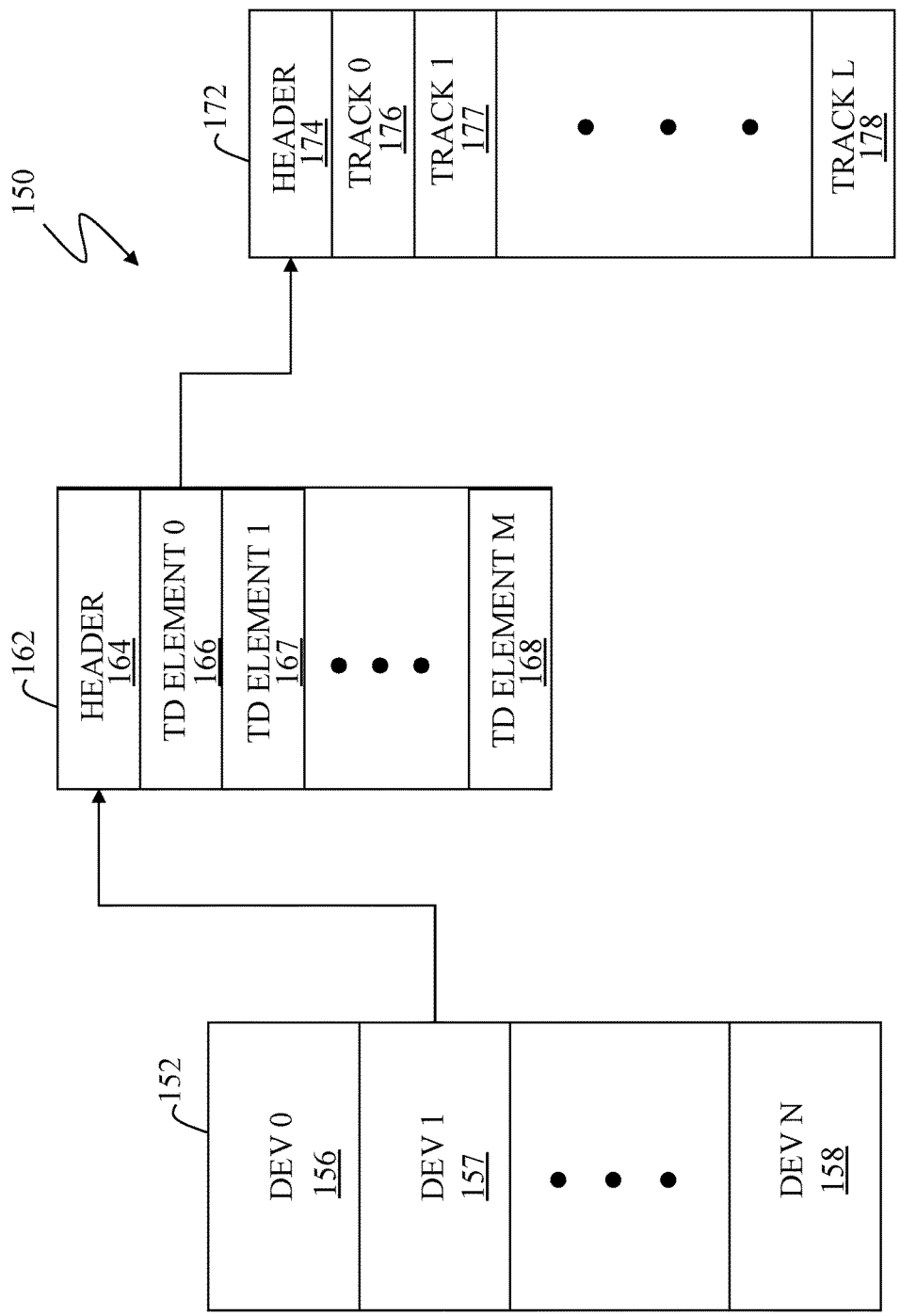
FIG. 5C is a schematic diagram illustrating tables that are used to keep track of device information in connection with an embodiment of the system described herein.

Referring to FIG. 5C, shown is a diagram 150 illustrating tables that are used to keep track of device information. A first table 152 corresponds to all of the devices used by a data storage system or by an element of a data storage system, such as an HA 21 and/or a DA 23. The table 152 includes a plurality of logical device (logical volume) entries 156-158 that correspond to all the logical devices used by the data storage system (or portion of the data storage system). The entries in the table 152 may include information for thin devices, for data devices (such as logical devices or volumes), for standard logical devices, for virtual devices, for BCV devices, and/or any or all other types of logical devices used in connection with the system described herein.

Each of the entries 156-158 of the table 152 correspond to another table that may contain information for one or more logical volumes, such as thin device logical volumes. For example, the entry 157 may correspond to a thin device table 162. The thin device table 162 may include a header 164 that contains overhead information, such as information identifying the corresponding thin device, information concerning the last used data device and/or other information including counter information, such as a counter that keeps track of used group entries (described below). The header information, or portions thereof, may be available globally to the data storage system.

The thin device table 162 may include one or more group elements 166-168, that contain information corresponding to a group of tracks on the data device. A group of tracks may include one or more tracks, the number of which may be configured as appropriate. In an embodiment herein, each group has sixteen tracks, although this number may be configurable.

One of the group elements 166-168 (for example, the group element 166) of the thin device table 162 may identify a particular one of the data devices 61-67 having a track table 172 that contains further information, such as a header 174 having overhead information and a plurality of entries 176-178 corresponding to each of the tracks of the particular one of the data devices 61-67. The information in each of the entries 176-178 may include a pointer (either direct or indirect) to the physical address on one of the physical disk drives of the data storage system that maps to the logical address(es) of the particular one of the data devices 61-67. Thus, the track table 162 may be used in connection with mapping logical addresses of the logical devices corresponding to the tables 152, 162, 172 to physical addresses on the disk drives or other physical devices of the data storage system.

The tables 152, 162, 172 may be stored in the global memory 25b of the data storage system. In addition, the tables corresponding to particular logical devices accessed by a particular host may be stored (cached) in local memory of the corresponding one of the HAs. In addition, an RA and/or the DAs may also use and locally store (cache) portions of the tables 152, 162, 172.

Figure 5D:
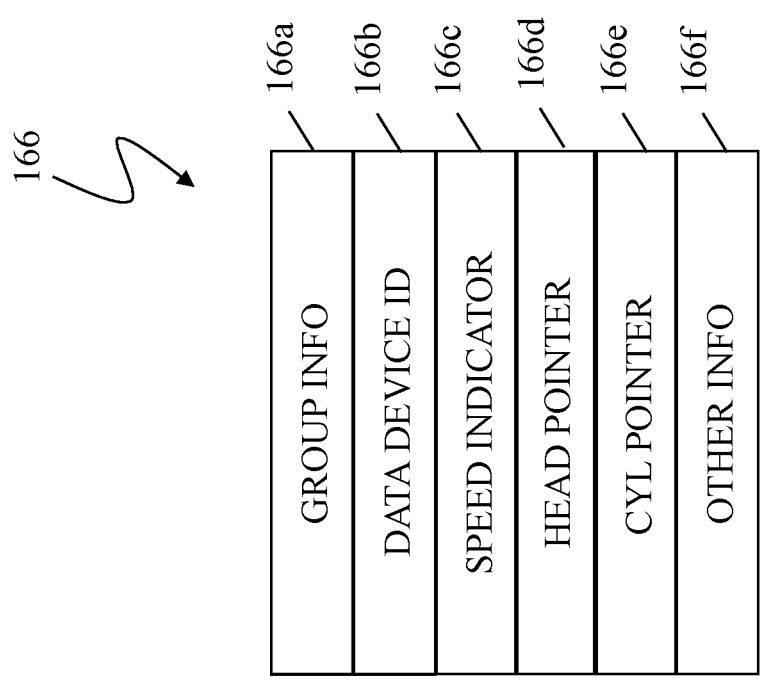
FIG. 5D is a schematic diagram showing a group element of a thin device table in connection with an embodiment of the system described herein.

Referring to FIG. 5D, shown is a schematic diagram illustrating a group element 166 of the thin device table 162 in connection with an embodiment of the system described herein. The group element 166 may include a plurality of entries 166a-166f. The entry 166a may provide group information, such as a group type that indicates whether there has been physical address space allocated for the group. The entry 166b may include information identifying one (or more) of the data devices 61-67 that correspond to the group (i.e., the one of the data devices 61-67 that contains pointers for physical data for the group). The entry 166c may include other identifying information for the one of the data devices 61-67, including a speed indicator that identifies, for example, if the data device is associated with a relatively fast access physical storage (disk drive) or a relatively slow access physical storage (disk drive). Other types of designations of data devices are possible (e.g., relatively expensive or inexpensive). The entry 166d may be a pointer to a head of the first allocated track for the one of the data devices 61-67 indicated by the data device ID entry 166b. Alternatively, the entry 166d may point to header information of the data device track table 172 immediately prior to the first allocated track. The entry 166e may identify a cylinder of a first allocated track for the one the data devices 61-67 indicated by the data device ID entry 166b. The entry 166f may contain other information corresponding to the group element 166 and/or the corresponding thin device. In other embodiments, entries of the group table 166 may identify a range of cylinders of the thin device and a corresponding mapping to map cylinder/track identifiers for the thin device to tracks/cylinders of a corresponding data device. In an embodiment, the size of table element 166 may be eight bytes.

Accordingly, a thin device presents a logical storage space to one or more applications running on a host where different portions of the logical storage space may or may not have corresponding physical storage space associated therewith. However, the thin device is not mapped directly to physical storage space. Instead, portions of the thin storage device for which physical storage space exists are mapped to data devices, which are logical devices that map logical storage space of the data device to physical storage space on the disk drives or other physical storage devices. Thus, an access of the logical storage space of the thin device results in either a null pointer (or equivalent) indicating that no corresponding physical storage space has yet been allocated, or results in a reference to a data device which in turn references the underlying physical storage space.

Thin devices and thin provisioning are described in more detail in U.S. patent application Ser. No. 11/726,831, filed Mar. 23, 2007 (U.S. Patent App. Pub. No. 2009/0070541 A1), AUTOMATED INFORMATION LIFE-CYCLE MANAGEMENT WITH THIN PROVISIONING, Yochai, EMS-147US, and U.S. Pat. No. 7,949,637, Issued May 24, 2011, Storage Management for Fine Grained Tiered Storage with Thin Provisioning, to Burke, both of which are incorporated by reference herein.

As discussed elsewhere herein, the data devices 61-67 (and other logical devices) may be associated with physical storage areas (e.g., disk drives, tapes, solid state storage, etc.) having different characteristics. In various embodiments, the physical storage areas may include multiple tiers of storage in which each sub-tier of physical storage areas and/or disk drives may be ordered according to different characteristics and/or classes, such as speed, technology and/or cost. The devices 61-67 may appear to a host coupled to the storage device 24 as a logical volume (logical device) containing a contiguous block of data storage, as discussed herein. Accordingly, each of the devices 61-67 may map to storage areas across multiple physical storage drives. The granularity at which the storage system described herein operates may be smaller than at the file level, for example potentially as small as a single byte, but more practically at the granularity of a single logical block or collection of sequential data blocks. A data block may be of any size including file system or database logical block size, physical block, track or cylinder and/or other size. Multiple data blocks may be substantially the same size or different sizes, such as different size data blocks for different storage volumes or different sized data blocks within a single storage volume.

In accordance with techniques herein, an embodiment may allow for locating all of the data of a single logical portion or entity in a same tier or in multiple different tiers depending on the logical data portion or entity. In an embodiment including thin devices, the techniques herein may be used where different portions of data of a single thin device may be located in different storage tiers, on multiple flash memory-based physical storage devices of multiple different write endurance classifications, and the like. As such, an embodiment in accordance with techniques herein may have added flexibility in that the first portion of data of the thin device may be located on a storage device of a first write endurance classification of flash memory-based physical storage devices and a second portion of data of the thin device may be located on a storage device of a second different write endurance classification of flash memory-based physical storage devices. For example, the first portion may be located on an MLC flash memory-based device and the second portion may be located on an SLC flash memory-based device.

Data used in connection with techniques herein may be obtained through observation and monitoring actual performance. Data may also be determined in other suitable ways such as, for example, through simulation, estimation, and the like. Observed or collected data may be obtained as described in connection with FIG. 3 by monitoring and recording one or more aspects of I/O activity for each TD, and portions thereof. For example, for each TD, and/or portions thereof, an average number of reads occurring within a given time period may be determined, an average number of writes occurring within a given time period may be determined, an average number of read misses occurring within a given time period may be determined, and the like. It should be noted that the operations of read and write with respect to an TD may be viewed as read and write requests or commands from the DA, controller or other backend physical device interface. Thus, these are operations may also be characterized as a average number of operations with respect to the physical storage device (e.g., average number of physical device reads, writes, and the like, based on physical device accesses). This is in contrast to observing or counting a number of particular type of I/O requests (e.g., reads or writes) as issued from the host and received by a front end component such as an FA. To illustrate, a host read request may not result in a read request or command issued to the DA if there is a cache hit and the requested data is in cache. The host read request results in a read request or command issued to the DA to retrieve data from the physical drive only if there is a read miss. Furthermore, when writing data of a received host I/O request to the physical device, the host write request may result in multiple reads and/or writes by the DA in addition to writing out the host or user data of the request. For example, if the data storage system implements a RAID data protection technique, such as RAID-5, additional reads and writes may be performed such as in connection with writing out additional parity information for the user data. Thus, observed data gathered to determine workload, such as observed numbers of reads and writes, may refer to the read and write requests or commands performed by the DA. Such read and write commands may correspond, respectively, to physical device accesses such as disk reads and writes that may result from a host I/O request received by an FA.

As described above, a thin device (also referred to as a virtually provisioned device) is a device that represents a certain capacity having an associated logical address range. Storage may be allocated for thin devices in chunks or data portions of a particular size as needed rather than allocate all storage necessary for the thin device's entire capacity. Therefore, it may be the case that at any point in time, only a small number of portions or chunks of the thin device actually are allocated and consume physical storage on the back end (on physical disks, flash or other physical storage devices). A thin device may be constructed of chunks having a size that may vary with embodiment. For example, in one embodiment, a chunk may correspond to a size as small as a single track, or may correspond to a group of 12 tracks (e.g., 12 tracks*64 Kbytes/track=768 Kbytes/chunk). As also noted with a thin device, the different chunks may reside on different data devices in one or more storage tiers. In one embodiment, as will be described below, a storage tier may consist of one or more storage pools. Each storage pool may include multiple LUNs and their associated physical devices. With thin devices, a system in accordance with techniques herein has flexibility to relocate individual chunks as desired to different devices in the same as well as different pools or storage tiers. For example, a system may relocate a chunk from a first storage pool of SLC flash memory-based drives to a second storage pool of MLC flash memory-based drives. In one embodiment using techniques herein, storage may be allocated for data portions the first time there is a write to the data portion whereby the storage may be allocated from one of the different write endurance classifications of flash memory-based drives. Techniques are described in following paragraphs for selecting a particular one of the write endurance classifications when there is a first write to a data portion, such as chunk, resulting in an initial allocation and mapping of physical storage for the data portion to the thin device's address space. Additionally, techniques are described in following paragraphs which may be performed when there are subsequent writes to the data portion to determine whether the currently selected write endurance classification in which the data portion is located is suitable based on a read-write mixture of an I/O workload directed to the data portion. Such techniques also provide for selecting a different one of the write endurance classifications when the current write endurance classification for the data portion is determined as unsuitable. Any chunks requiring allocation of additional storage, such as may occur when writing data to the thin device, result in allocating storage from one of multiple storage pools of flash memory-based drives of different write endurance classifications. For example, there may be a first storage pool of MLC drives and a second storage pool of SLC drives.

A thin device may contain thousands and even hundreds of thousands of such chunks. As such, tracking and managing workload and performance data such as one or more workload and performance statistics for each chunk, across all such chunks, for a storage group of thin devices can be cumbersome and consume an excessive amount of resources. Thus, in at least one embodiment in accordance with techniques herein may track workload information, such as indicating a read-write mixture of I/O workload, at a level higher than a chunk.

Figure 6A:
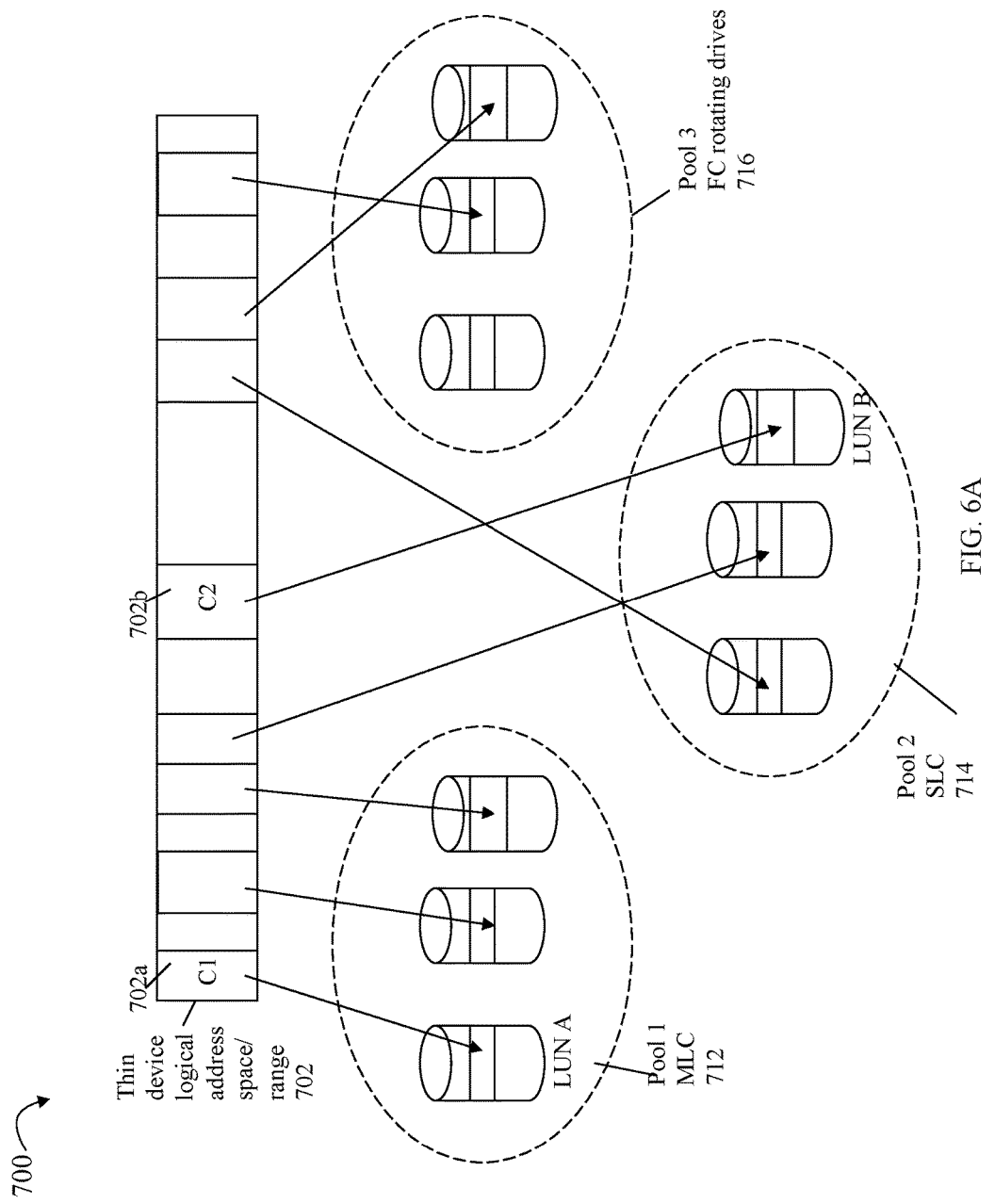
FIGS. 6A and 6B are examples illustrating thin devices and associated structures that may be used in an embodiment in accordance with techniques herein.

Referring to FIG. 6A, shown is an example 700 illustrating use of a thin device in an embodiment in accordance with techniques herein. The example 700 includes three storage pools 712, 714 and 716 with two of the pools (712, 714) each representing a storage pool of flash memory-based drives of different write endurance classifications and a third pool (716) representing a storage pool of FC rotating disk drives. For example, pool 712 may represent a storage pool of MLC flash storage devices and pool 714 may represent a storage pool of SLC storage devices. Each storage pool may include a plurality of logical devices and associated physical devices (or portions thereof) to which the logical devices are mapped. Element 702 represents the thin device address space or range including chunks which are mapped to different storage pools. For example, element 702a denotes a chunk C1 which is mapped to storage pool 712 and element 702b denotes a chunk C2 which is mapped to storage pool 714. Element 702 may be a representation of logical address space for a first thin device.

Figure 6B:
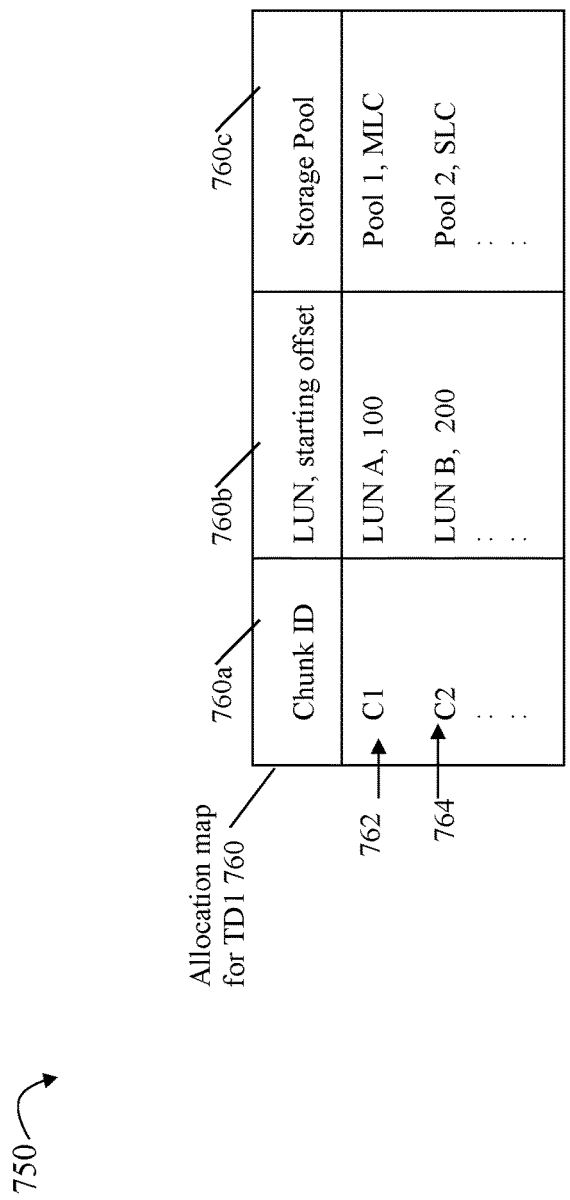

Referring to FIG. 6B, shown is an example representation of information that may be included in an allocation map in an embodiment in accordance with techniques herein. An allocation map may be used to identify the mapping for each thin device (TD) chunk (e.g. where each chunk is physically located). Element 760 represents an allocation map that may be maintained for each TD. In this example, element 760 represents information as may be maintained for a single TD although another allocation map may be similarly used and maintained for each other TD. Element 760 may represent mapping information as illustrated in FIG. 6A such as in connection the mapping of 702 to different storage pool devices. The allocation map 760 may contain an entry for each chunk and identify which LUN and associated physical storage is mapped to the chunk. For each entry or row of the map 760 corresponding to a chunk, a first column 760a, Chunk ID, denotes an identifier to uniquely identify the chunk of the TD, a second column 760b, indicates information about the LUN and offset to which the chunk is mapped, and a third column storage pool 760c denotes the storage pool including the LUN of 760b. For example, entry 762 represents chunk C1 illustrated in FIG. 6A as 702a and entry 764 represents chunk C2 illustrated in FIG. 6A as 702b. It should be noted that although not illustrated, the allocation map may include or otherwise use other tables and structures which identify a further mapping for each LUN such as which physical device locations map to which LUNs. This further mapping for each LUN (e.g., used a data device) is described and illustrated elsewhere herein such as, for example, with reference back to FIG. 5B. Such information as illustrated and described in connection with FIG. 8B may be maintained for each thin device in an embodiment in accordance with techniques herein.

In connection with collecting statistics characterizing performance, workload and/or activity for a thin device, one approach may be to collect the information per chunk or, more generally, for the smallest level of granularity associated with allocation and deallocation of storage for a thin device. Such statistics may include, for example, a number of reads/unit of time, a total number of reads, a total number of writes, #writes/unit of time, a ratio denoting a read-write mixture of reads received/writes received, a number of prefetches/unit of time, and the like. However, depending on the particular embodiment, collecting such information at the smallest granularity level does not scale upward as number of chunks grows large such as for a single thin device which can have up to, for example 300,000 chunks.

Therefore, an embodiment in accordance with techniques herein may collect statistics, such as related to workload and performance information, on a grouping of "N" chunks also referred to as an extent, where N represents an integer number of chunks, N>0. N may be, for example, 480 in one embodiment. Each extent may represent a consecutive range or portion of the thin device in terms of thin device locations (e.g., portion of the address space or range of the thin device). Note that the foregoing use of consecutive does not refer to physical storage locations on physical drives but rather refers to consecutive addresses with respect to a range of addresses of the thin device which are then mapped to physical device locations which may or may not be consecutive, may be on the same or different physical drives, and the like. For example, in one embodiment, an extent may be 480 chunks (N=480) having a size of 360 MBs (megabytes). Although an exemplary embodiment herein may collect statistics regarding workload and/or performance information per extent, more generally, an embodiment may collect statistics regarding workload and/or performance at any suitable level of granularity such as per chunk, per extent, and the like.

An extent may be further divided into sub extents, where each sub extent is a collection of M chunks. M may be, for example 10 in one embodiment. In one embodiment, the sub-extent size may correspond to the smallest granularity of data movement. In other words, the sub extent size represents the atomic unit or minimum amount of data that can be operated upon when performing a data movement such as between storage tiers for data movement optimizations. As described in more detail elsewhere herein, techniques herein provide for allocating and/or relocating data portions at the chunk level.

Figure 7:
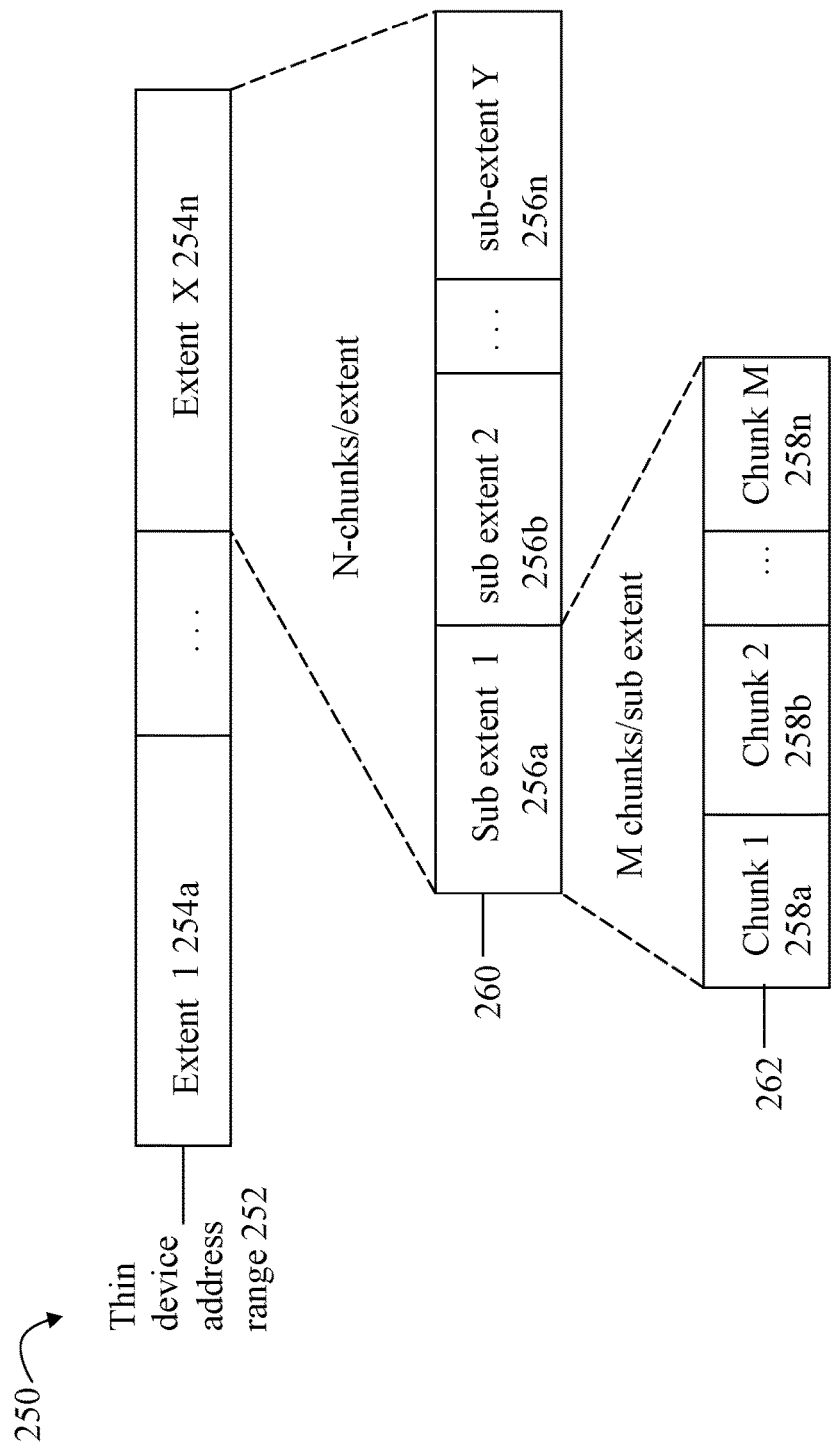
FIG. 7 is an example illustrating data portions comprising a thin device's logical address range.

Referring to FIG. 7, shown is an example illustrating partitioning of a thin device's address space or range in an embodiment in accordance with techniques herein. The example 250 includes a thin device address space or range 252 which, as described elsewhere herein, includes chunks mapped to physical storage locations. The thin device address space or range 252 may be partitioned into one or more extents 254a-254n. Each of the extents 254a-254n may be further partitioned into sub-extents. Element 260 illustrates that extent X 254n may include sub extents 256a-256n. Although only detail is illustrated for extent 254n, each of the other extents of the thin device also include a same number of sub extents as illustrated for 254n. Each of the sub extents 256a-256n may represent a grouping of "M" chunks. Element 262 illustrates that sub extent 1 256a may include chunks 258a-258n. Although only detail is illustrated for sub extent 256a, each of the other sub extents 256b-256n also include a same number of "M" chunks as illustrated for 256a. Thus, each of the extents 254a-254n may represent an grouping of "N" chunks, where $$N = \text{\# sub extents/extent} * M \text{ chunks/sub extent} \quad \text{EQUATION 1}$$

An embodiment in accordance with techniques herein may collect statistics for each extent, or more generally data portion, as described in more detail elsewhere herein.

It should be noted that although the techniques described herein are used with thin devices providing virtual storage provisioning, the techniques herein may also be used in connection with other types of suitable devices such as those not providing virtual provisioning.

An embodiment in accordance with techniques herein may include multiple types of flash memory-based storage devices, or more generally, multiple write endurance classifications. For example, an embodiment may include any two or more of the following types of flash memory-based storage device where each type may be a different write endurance classification:
1. SLC—single level cell
2. eMLC—enterprise multi-level cell
3. MLC—multi-level cell 4. TLC—triple-level or tri-level cell
5. cMLC—(consumer grade) multi-level cell The above is a ranking in terms of expected writes/GB whereby the top or highest/first ranked flash type is able to sustain the greatest number of writes/GB of all types of all types considered/ranked/listed and the bottom or lowest/last ranked flash type is able to sustain the least number writes/GB of all types considered and included in the foregoing ranking. Thus, the above is a ranking of flash types, or write endurance classifications of different flash memory-based devices, based on their relative expected write endurance.

Different I/O workloads may be preferred for the different types of flash drives based on the ranking, with higher/highest read intensity workloads being biased or preferred toward the bottom ranked flash types with the lowest/lower write endurance and higher write intensity workloads being biased or preferred toward the highest ranked flash types with the highest/highest write endurance.

Figure 8:
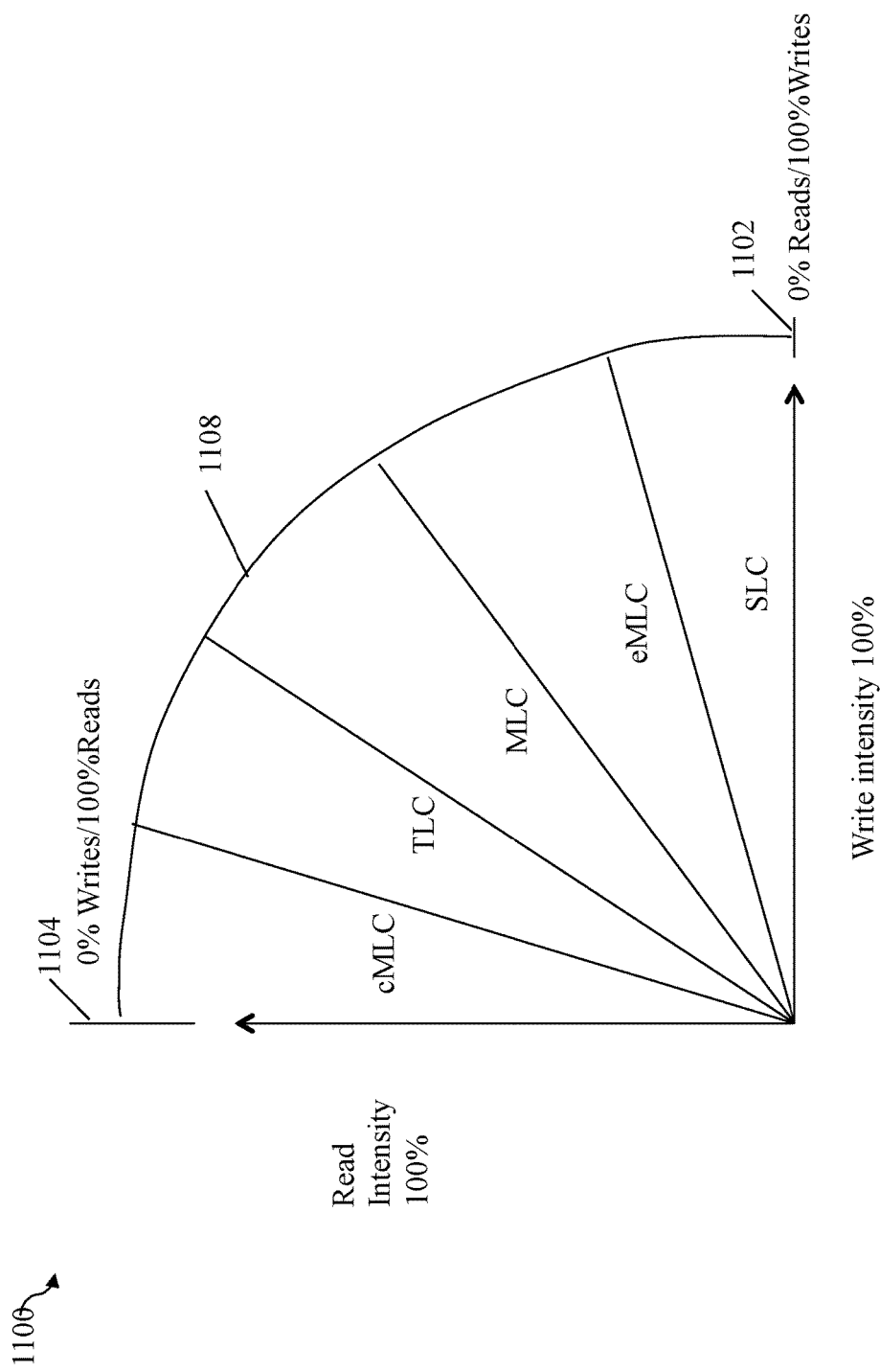
FIG. 8 is an example illustrating different types or classifications of flash memory-based storage devices and preferred read-write mixtures for such types or classifications in an embodiment in accordance with techniques herein.

Referring to FIG. 8, shown is an example 1100 that generally illustrates the foregoing of expected write endurance and preferred workload of I/O mixture for each write endurance classification or flash type relative to the others as set forth in the ranking noted above. An I/O workload may have a read/write mixture that ranges from all writes or write intensity 100% to all reads or read intensity 100%. The arc or curve 1108 may generally represent read write mixtures or read/write ratios of I/O workloads ranging from a first mixture or ratio denoted by 1102 to a second mixture or ratio denoting by 1104. As illustrated, 1102 may denote the point on the curve 1108 for 100% writes and 1104 may denote the point on the curve 1108 for 100% reads. A point in the curve 1108 between 1102 and 1104 may represent a read/write mixture of a workload and the particular type denoted under the curve where the point falls may generally identify a suitable or preferred flash type for a workload having the read/write mixture. It should be noted that the particular boundaries or partitioning of the full range of read/write ratios or values represent by 1108 among the different write endurance classifications may vary with embodiment. For example, some embodiments may overlap the read/write ratio boundaries associated with two or more adjacently ranked classifications depending on the particular characteristics associated with the different physical storage devices used in an embodiment. Additionally, although the example 1100 shows the range of read/write ratios of 1108 as being partitioned in approximately equal parts between the different write endurance classifications, an embodiment may map any suitable portion of the range of read/write ratios of 1108 to each write endurance classification.

In some embodiments, the representation of 1100 may logically represent a preferred general ranking or ordering as described herein based on order of priority, preference, or bias for storing data having an I/O workload that is predominantly reads (e.g., more than 50% reads) or predominantly writes (e.g. more than 50% writes). In such an embodiment, those data portions having the highest amount of writes or highest write ratios may be stored in those write endurance classifications preferred or most suitable for writes such as SLC, and those data portions having the highest read ratios or highest reads may be stored in those write endurance classifications preferred or most suitable for reads such as cMLC.

Described in following paragraphs are techniques that may be used to cluster groups of address space associated with different data portions of logical devices, such as thin devices, based on the read/write ratio or mixture of read and writes of the workloads of the different data portions. Using such techniques, logical address space portions or subranges (or data portions mapped such logical address) that are predominantly writes may be biased toward the higher/highest write endurance flash memory-based devices and logical address space portions or subranges (or data portions mapped such logical address) that are predominantly reads may be biased toward the lower/lowest write endurance flash memory-based devices.

In one embodiment, assume that there are two or more types of flash memory-based devices or write endurance classifications and where there is an equal amount of storage capacity for each such classification. For example, if there are MLC and SLC drives in an embodiment, assume that there is a same amount of physical storage capacity of MLC drives and SLC drives. In such an embodiment, workload information, such as read/write ratio or mixture, may be tracked at the extent level and storage may be allocated for TDs at the chunk level where there are multiple chunks per extent. Thus, storage may be allocated for a single chunk in an extent of a TD where the chunk may be stored on a flash drive of a first write endurance classification. However, workload information may be collected at the extent level for one or more chunks of the extent stored on flash drives of the first write endurance classification. This is described in more detail in following paragraphs.

It should be noted that an embodiment may track, for each extent having at least one chunk stored on a particular type of flash drive, the number of reads and number of writes to determine in an ongoing manner the read-write mixture or ratio for that extent. The read-write mixture or ratio may consider all I/Os over a particular time period directed to the extent. An embodiment may determine the read-write mixture or ratio using any suitable technique. For example, the read-write mixture or ratio may use a weighting technique where more recent I/Os are weighted more heavily than previous, less recent I/Os. In this manner, the ratio may change over time and be weighted toward the most recent I/Os. Another technique is that an embodiment may determine multiple such read-write mixtures or ratios for each extent for, example, for different times of the day, week, month, etc. In one embodiment, the read-write mixture or ratio may be characterized as a two-week moving average where the read-write mixture is based on the average read-write mixture of I/O operations received in a window or time period of two weeks.

In following paragraphs, described is a simplified example based on the assumption that each flash type or write endurance classification provides a same amount of storage capacity for storing user data. Furthermore, as a simplified assumption for purposes of representation, assume that each thin or virtually provisioned device (e.g., each TD) has the same storage capacity or logical address range. In this example, assume that there are X LUNs (X generally being an integer>0). Although each of the X TDs may generally be any suitable capacity and associated logical address range, in this simplified example, each of the X LUNs has the same associated logical address range and capacity. The storage capacity or logical address range of each of the X TDs may be partitioned into M units or portions where each of the M units or portions may represent the same amount of storage capacity. (M generally being an integer>0). In an embodiment described herein, each of the M portions of one of the X TDs may be the size of an extent which includes multiple chunks (e.g., multiple individual storage allocation units). Thus, in the embodiment described herein, although each of the M portions may be the size of an extent (e.g., for which workload information including the read-write mixture is tracked), storage may not be allocated for all chunks within a single one of the M portions. Additionally, chunks of storage within the same extent may be mapped to (e.g., have their data stored on) multiple different types of flash (e.g. different write endurance classifications). Thus, although workload information is tracked at the extent level for each TD extent, more specifically, an embodiment in accordance with techniques herein may track workload information at the extent level for the particular chunks of each TD extent having storage allocated in a particular write endurance classification.

Consider the following to illustrate. For example, consider a first thin device TD1 with a first logical address space where storage is allocated for a first chunk C1 in a first extent E1 of TD1 where E1 has a corresponding first logical address subrange of TD1's first logical address space. C1 may also correspond to a second subrange of logical address(es) within the first logical address subrange. Data for C1 may be stored on a first physical storage portion of an SLC drive where the first physical storage portion is mapped to the second subrange of logical address(es) for C1 of TD1 (e.g., such as via an allocation map as described above and illustrated in FIG. 6B). Assume, currently, that C1 is the only chunk of E1 for which physical storage has been allocated (e.g., storage has not been allocated for any other chunk in E1 of TD1's logical address space so that no other chunk in E1 is mapped to physical storage per TD1's allocation map). In this case, the workload information tracked for E1 of TD1 with respect to the SLC write endurance classification or flash type includes only information for C1. At a later point in time, assume a second chunk C2 within E1 of TD1 has physical storage allocated so that both C1 and C2 of E1 of TD1 are stored on an SLC drive (e.g., C1 and C2 are both stored on physical storage in the same write endurance classification). Subsequent to this later point in time, the workload information for the SLC type tracked for E1 of TD1 may reflect I/Os directed collectively to both C1 and C2.

As another example, consider an SLC flash type or write endurance classification with multiple TDs. Data stored on SLC flash memory-based media may include a first chunk from a first extent of a first TD, TD1, and a second chunk from a second extent of a second TD, TD2. First workload information may be tracked for the first extent of TD1 (such as based on I/O workload directed to the first chunk), and second workload information may be tracked for the second extent of TD2 (such as based on I/O workload directed to the second chunk). Thus, an embodiment may track the workload information (e.g., including the read/write mixture or ratio) with respect to each write endurance classification at an extent-level/per extent where each such extent corresponds to a subrange of logical address space of a single TD based on I/Os that are 1). directed to data stored on physical storage of that write endurance classification and 2). directed to any logical address in the logical address subrange for that extent (e.g., one or more chunks of SLC storage have been allocated and store data for extent E1 of TD1, where E1 has a corresponding subrange of TD1's logical address space, and workload information W1 for extent E1 of TD1 for SLC is based on I/Os directed to any data portion having a corresponding logical address in the subrange and the data portion is stored on SLC storage).

It should also be noted that data for two chunks C1 and C2 from the same extent E1 of the same TD1 may be stored in different types of flash memory-based physical drives (e.g. stored on drives of different write endurance classifications). For example, C1 may be stored on an SLC drive and C2 may be stored on MLC drive and there may be two sets of workload information tracked for E1—first workload information with respect to I/O workload of E1 directed to chunks stored on SLC and second workload information with respect to I/O workload of E1 directed to chunks stored on MLC.

Thus, for a particular flash type or write endurance classification such as SLC, different ones of the M portions of each TD may include one or more chunks having storage allocated from (and data stored on) physical devices of the SLC classification. In an embodiment described herein, each of the M portions of one of the X TDs may be the size of an extent which includes multiple chunks (e.g., multiple individual storage allocation units). Workload information may be tracked for each such extent having storage allocated from a particular flash type where, within such an extent, physical storage is allocated from the particular flash type for at least one chunk's worth of the logical addresses in the extent.

Figure 9:
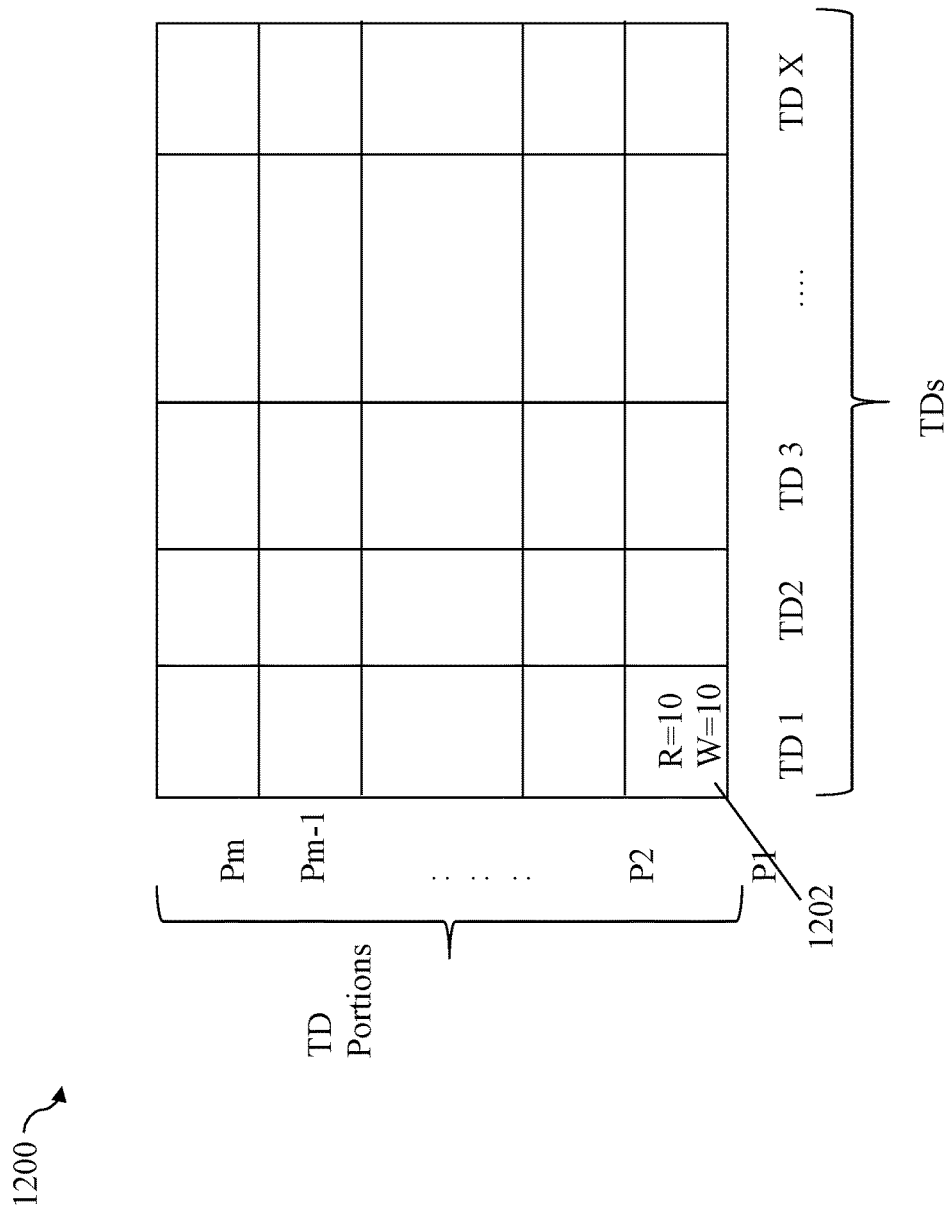
FIG. 9 is an example of extents for which workload information may be tracked for each type or classification of flash memory-based storage devices in an embodiment in accordance with techniques herein.

Referring to FIG. 9, shown is an example of table of information that may be collected for each write endurance classification. The table 1200 may include statistics, or more generally workload information such as information denoting a read/write mixture, collected for each logical address subrange or portion of a TD (such as an extent of the TD) having at least one chunk with its physical storage allocated from the represented write endurance classification. An instance of the table 1200 may include statistics collected for each of the M portions of each of the X LUNs. The table 1200 includes a column for each LUN that includes statistics for each of the M portions of that LUN. For example, column 1 of table 1200 includes statistics for LUN 1. A row of the table of 1200 includes statistics for the same portion of each of the X LUNs. For example, the last row of the table includes statistics for portion P1 of each of the X LUNs. A cell or entry of the table may correspond to a particular portion and may be identified by a LUN and a portion of that LUN. For example, element 1202 identifies an entry or cell of the table 1200 that includes statistics, such as the number of reads and the number of writes, for portion P1 of LUN 1 (also denoted as LUN1, P1 where LUN1 identifies the column and P1 identifies the row). In this example, 1202 indicates that 10 reads and 10 writes have been directed to LUN1, P1. Thus, element 1202 indicates that portion LUN1, P1 is 50% reads. In one embodiment as described herein, each Pi denoting a TD portion may be an extent having a corresponding subrange of the TD's logical address space.

In one embodiment having the following 5 types of flash memory-based devices corresponding to 5 write endurance classifications—SLC, MLC, eMLC, TLC and cML—an instance of the table 1200 may be maintained for each of 5 types or classifications. From each such table 1200, a distribution as illustrated in FIG. 10 regarding the read-write mixtures may be determined.

Figure 10:
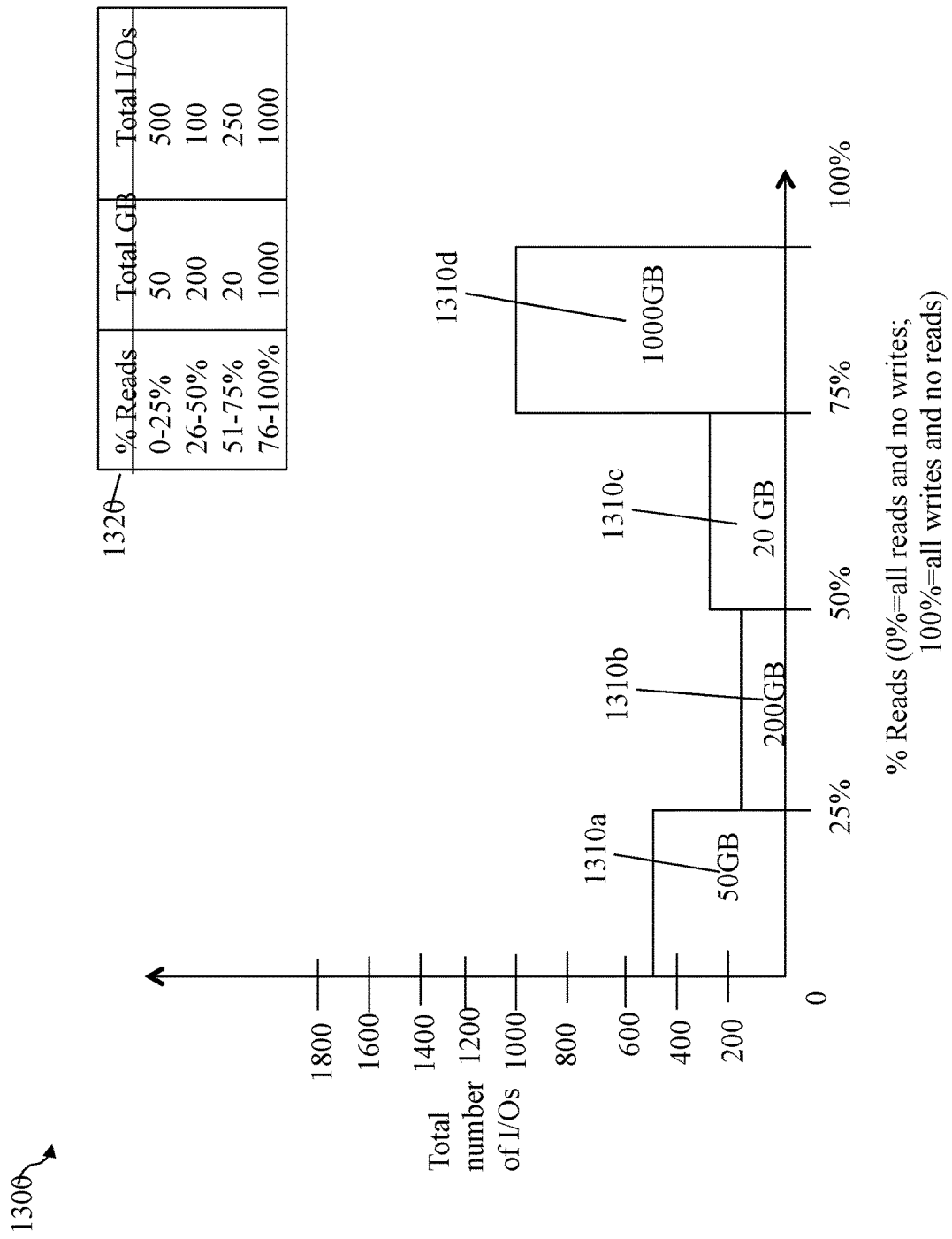
FIG. 10 is an example illustrating a table and associated graphical illustration of workload information indicating read-write mixtures for extents for each type or classification of flash memory-based storage devices that may be used in an embodiment in accordance with techniques herein.

In FIG. 10, shown is a table 1320 denoting a distribution of the different read-write mixtures for one of the flash types or write endurance classifications. For example, the information of table 1320 for SLC may be determined using the information in table 1200 for SLC. The graphical illustration of 1300 graphically represents the information of table 1320 for the single flash type or write endurance classification such as SLC.

The table 1320 includes a first column, % Reads, identifying buckets or ranges of read percentages, a second column total GB denoting a total GB capacity, and a third column total I/Os denoting a total number of I/Os. For a row of the table identifying a particular read range or bucket (denoted by column 1% Reads), column 2, total GB, identifies a total GB capacity associated with the data portions stored on the flash type having a percentage of reads that fall into the particular read range or bucket (denoted by column 1% Reads), and column 3, total I/Os, identifies a total number of I/Os directed to the data portions stored on the flash type having a percentage of reads that fall into the particular read range or bucket (denoted by column 1% Reads). For example, let the information in 1300 and 1320 identify information regarding data portions stored on a first type of flash storage such as SLC at a point in time. Summing the last column (total GB), a total of 1,250 GB of data is stored on devices of the first type of flash storage. By the last line of table 1320, (76-100% reads bucket), 1000 GB of the data has a workload that is 76-100% reads with a total of 1000 I/Os being directed to the 1000 GB.

The example 1300 also includes a graphical illustration of the information in table 1320 with the X-axis denoting the % Reads (read ranges or buckets corresponding to column 1 of table 1320) and Y-axis denoting the total number of I/Os (corresponding to column 3 of table 1320). The height of each read % bucket represents the total number of I/Os of all data portions in the read % bucket. For example, the height of % read range 0-25% is 500 I/Os. In this particular graphical illustration, the total GB capacity (corresponding to column 2 of table 1320) of each read range or bucket is denoted by the GB counters 1310*a-d* in the 4 read % ranges or buckets. It should be noted that the information of table 1320 may be graphically represented in other suitable ways.

To further illustrate, the information of table 1200 and of table 1320 may be for SLC. Referring back to table 1200 and assuming that the example 1200 is collected for the SLC flash type, element 1202 denotes a read-write mixture or ratio of 50%. Based on the percentage ranges in column 1 of table 1320, the workload of extent P1 of TD1 having data stored on SLC falls into the second bucket or range of 26-50% reads denoted by the second row of table 1320. The size (e.g. GB capacity) of the one or more chunks of TD1, P1 having storage allocated from SLC may be added to the total GB of the second row and the total I/Os directed to such chunks may be added to the total I/Os of the second row.

The information in the example 1300 provides a distribution of read-write mixtures for the particular flash type or write endurance classification such as SLC. Assuming the information in 1300 is for SLC which has a workload preference of predominantly writes, it can be seen that extents and associated chunks classified in the 76-100% read range (since such chunks currently have their data stored on SLC) may be candidates for relocation to another more suitable flash type or classification such as cMLC. Extents and associated chunks classified in the 51-75% read range (since such chunks currently have their data stored on SLC) may be candidates for relocation to another more suitable flash type or classification such as TLC or MLC. Such relocation and use of information in FIGS. 9 and 10 that may be performed in an embodiment in accordance with techniques herein are described in more detail below.

Figure 11A:
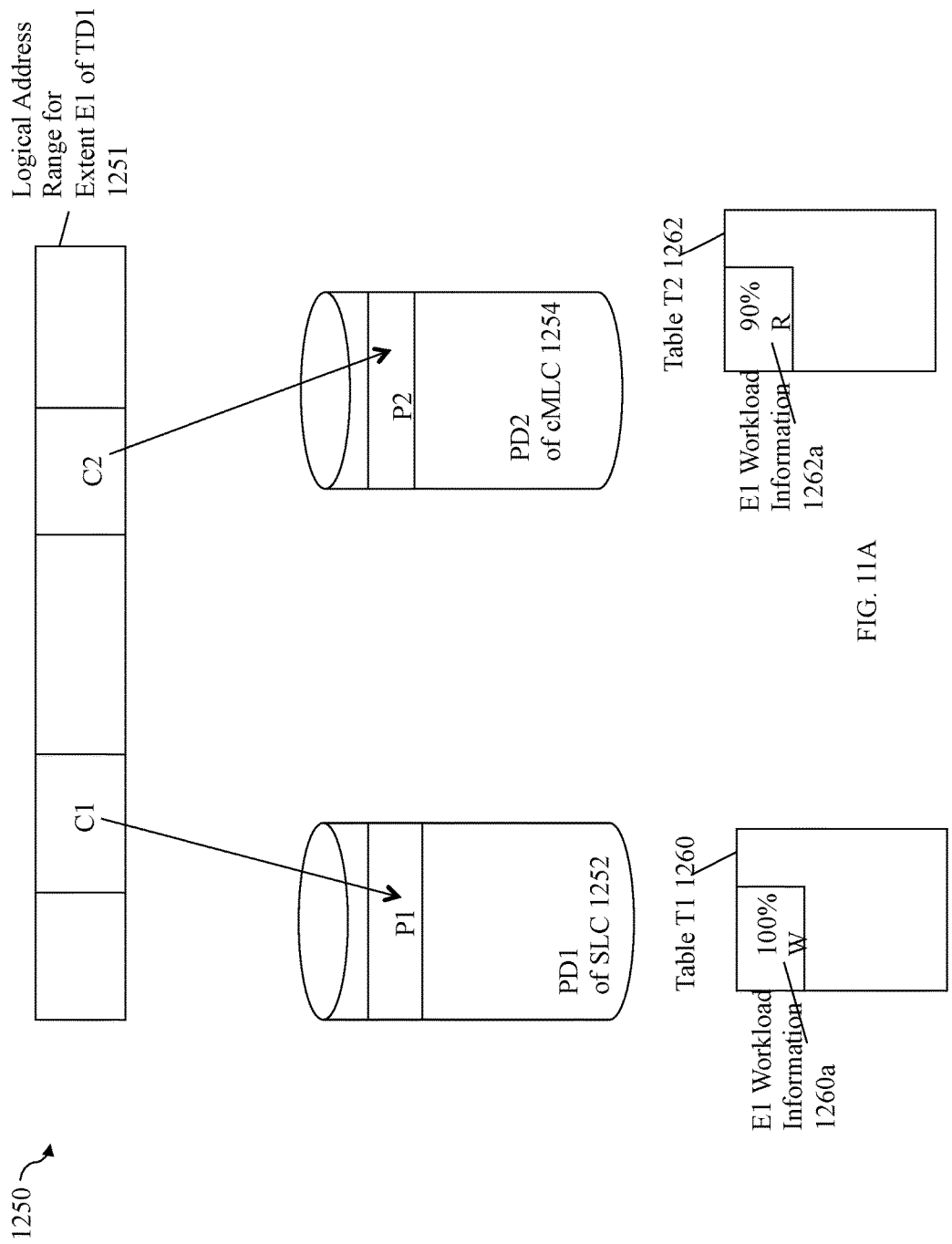
FIGS. 11A and 11B are examples illustrating use of techniques described herein.

With reference to the example 1250 of FIG. 11A, a first extent E1 of thin device TD1 may have a logical address subrange or portion represented by 1251 that includes multiple chunks. In this example, chunk C1 of the first extent E1 may have its data stored on a physical device 1252 of a first write endurance classification, such as SLC, and a second chunk C2 of the same first extent E1 may have its data stored on a physical device 1254 of a second different write endurance classification, such as cMLC. A different instance of the table 1200 may be maintained for each of the first and second write endurance classifications. For example, a first table 1260 may store workload information for the first write endurance classification, SLC, and a second table 1262 may store workload information for the second write endurance classification cMLC In this manner, the first table 1260 may include first workload information 1260*a* regarding those one or more chunks (like the first chunk C1) of the first extent E1 mapped to a physical device 1252 of the first write endurance classification SLC and the second table 1262 may include second workload information 1262*a* regarding those one or more chunks (like the second chunk C2) of the first extent E1 mapped to a physical device 1254 of the second write endurance classification cMLC. At a first point in time, assume that C1 and C2 are the only chunks of E1 currently having allocated storage. Thus, 1260*a* indicates that the I/O workload for C1 is 100% writes and 1262*a* indicates that the I/O workload for C2 is 90% reads. As more I/Os are directed to the first chunk C1, only the first workload information 12601 of the first table 1260 is updated (i.e., since the first chunk C1 is currently mapped to 1252 of the first write endurance classification SLC). Similarly, as more I/Os are directed to the second chunk C2, only the second workload information 1262*a* of the second table 1262 is updated (i.e., since the second chunk C2 is currently mapped to 1254 the second write endurance classification cMLC).

Figure 11B:
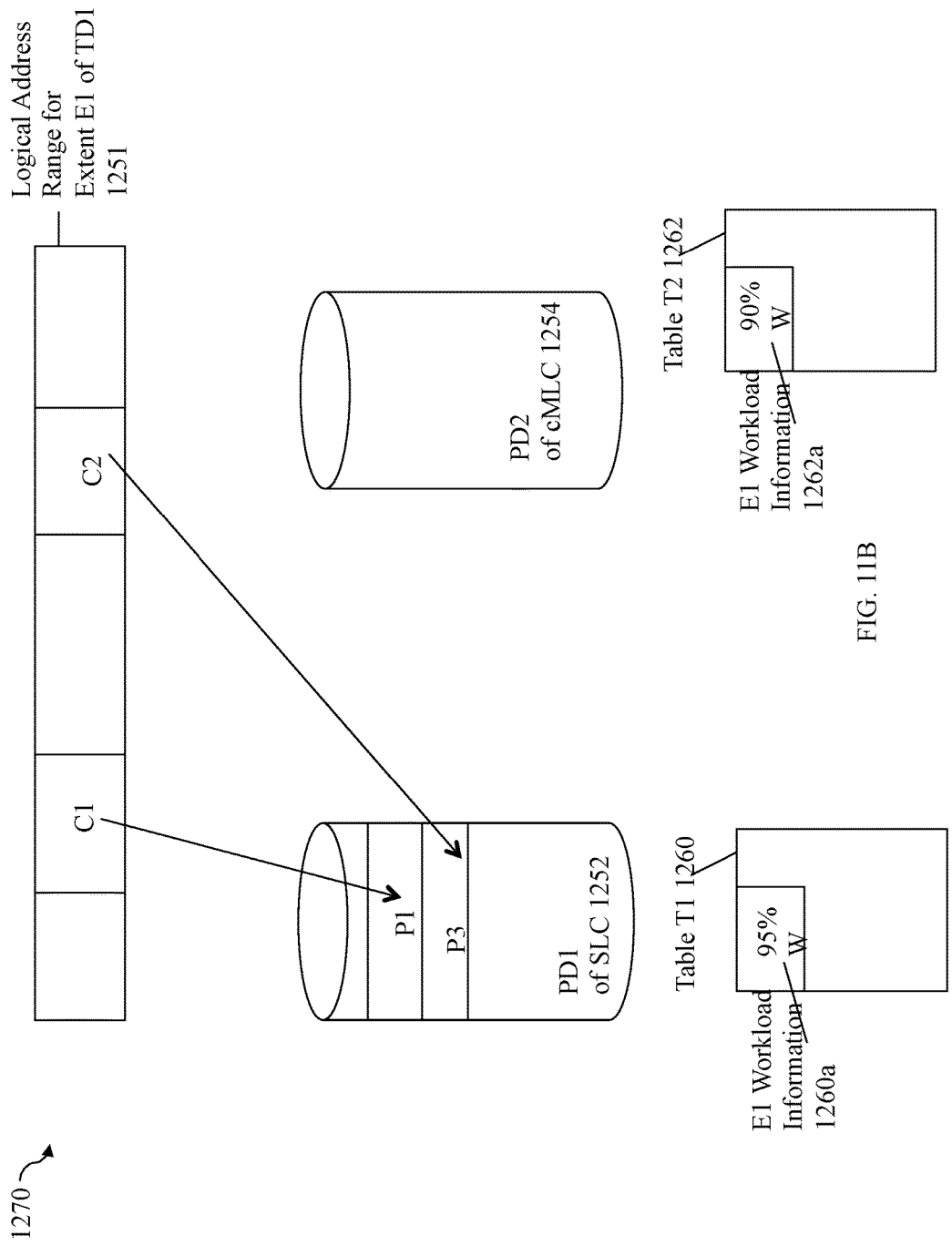

At a second point in time, additional I/Os may be issued to C2 causing the read/write mixture or ratio for C2, and thus read-write mixture as tracked in 1262 to go from 90% reads to 90% writes. Due to this change in C2's reads/write mixture, processing may be performed that determines the current cMLC device where the chunk C2 is currently stored is not suitable for storing C2's data. Due to the workload of C2 being predominantly writes, processing may be performed that selects a target write endurance classification to which to relocate C2. Such processing may select the first write endurance classification of SLC as the target. As illustrated in FIG. 11B, the second chunk C2 may be moved or relocated to have its data stored on portion P3 of the physical device 1252 of the first write endurance classification SLC whereby I/Os directed to the second chunk C2 after the relocation (while the second chunk C2 is mapped to the physical device portion 1252 of the first write endurance classification SLC) are now reflected in the first workload information 1260*a* along with any I/Os directed to the first chunk C1.) After the relocation, assume that additional I/Os are directed to both C1 and C2 while both C1 and C2 are stored on device 1252. As illustrated in FIG. 11B, the first workload information 1260*a* for extent E1 is updated to 95% writes to reflect the updated read-write mixture as a result of the additional I/Os. In the example of FIG. 11B, an assessment of whether the SLC classification is suitable for C1 and/or C2 may use the same information 1260*a* at the extent level. Similarly, if processing were to determine that the SLC classification is not suitable, the workload information 1260*a* at the extent level may be used to select a suitable write endurance classification to which to move C1 and/or C2.

Thin or virtually provisioned devices may be allocated in an on-demand fashion. For example, the first time there is a write to a particular logical address of a chunk, storage for that chunk may be initially allocated such as from one of the 5 different flash types or write endurance classifications. In one embodiment in accordance with techniques herein, the initial allocation for a TD chunk may be made from one of the flash types or write endurance classifications selected from a ranked list of all flash types or write endurance classifications. Since there has never been an I/O issued previously to the chunk prior to this initial allocation, there is no workload data in existence for the chunk. Thus, the initial allocation may be made from one of the flash types based on a predefined ranking of the different types or write endurance classifications where the ranking reflects an relative ordering of the classifications based on their respective relative write endurance of each of the classifications. Assuming there is the same amount of storage capacity of each of the 5 flash type or classifications as described elsewhere herein, the ranking may also be as mentioned elsewhere herein as follows:

1. SLC—
2. eMLC
3. MLC
4. TLC
5. cMLC where 1 is the highest ranked classification with the highest write endurance and 5 denotes the lowest ranked write endurance classification with the lowest write endurance.

For a chunk's initial storage allocation upon a first write to the chunk, the highest ranked classification (having the highest write endurance) may be a first choice. Thus, the ranking may generally represent a preferred ordering in which storage may be initially allocated for address space. If there is no physical storage available in the SLC classification or it is otherwise determined that there is an insufficient amount of storage available in the SLC classification for allocation for a chunk, storage may be allocated from the next ranked classification in ranked list. Similarly, when initially allocating storage upon a first write to a chunk, attempts to allocate storage may be made as needed traversing the ranked list from highest to lowest to determine one of the flash types with available storage capacity for the new allocation.

It should be noted that the above ranking is based on an assumption of equal storage capacity for each flash type. The above ranking may change based on the storage capacities of the classifications which thereby also varies the total writes/day allowed for a classification. The ranking mentioned above may be based on equal amounts of all classifications so that each classification has an associated expected write endurance, such as writes/day, that may be performed to the classification to maintain a particular expected lifetime of the storage device. Thus the ranking may be based on a write endurance metric, such as a maximum allowable average number of writes/day, that can be performed collectively with respect to all PDs of each classification. If the amount or quantity of PDs (and thus total storage capacity) of a classification increases, the number of writes/day for that classification changes and so may its position in the relative ranking. As known in the art, flash drives may have write endurance expressed in full drive write per day based an expected lifetime of usage. For example, a 200 GB drive having N full drive writes per day (to last for a specified lifetime such as 5 years) may write 200*N GB per day. Thus, the writes/day may be characterized as an average amount of allowable writes/day in order to have the physical device operate for the specified lifetime.

For example, consider the following first configuration of available physical storage amounts and associated allowable writes/day for all devices of each classification:

| Classification | Amount in GB | Writes/day |
| --- | --- | --- |
| SLC | X GB | 30 writes/day |
| MLC | X GB | 15 writes/day |

SLC has a relative ranking higher than MLC based on this first configuration. Now consider a second configuration where the amount of MLC is double that of SLC. In this case, the writes/day for all devices of the MLC classification also doubles as below:

| Classification | Amount in GB | Writes/day |
| --- | --- | --- |
| SLC | X GB | 30 writes/day |
| MLC | 2X GB | 30 writes/day |

Thus, the ranking may be adjusted so that SLC and MLC are both ranked at the same relative position.

Now consider a third configuration where the amount of MLC is triple the amount of SLC from the first configuration. In this case, the writes/day for all devices of the MLC classification also triples (relative to the first configuration) as below:

| Classification | Amount in GB | Writes/day |
| --- | --- | --- |
| SLC | X GB | 30 writes/day |
| MLC | 3X GB | 45 writes/day |

In this case, the ranking may be adjusted so that MLC is now ranked above SLC (MLC's 45/writes day>SLC's 30 writes/day) when the total storage capacity for the classifications are as above.

Thus, generally, the classifications may be characterized as ranked relative to one another based on the write endurance for the classification where the write endurance for a classification may be based on the total sum of allowable writes collectively across all PDs or the entire storage capacity for the classification.

Thus, in connection with a first write to a chunk, storage may be initially allocated from one of the flash types or write endurance classifications based on the predetermined relative ranking of the classifications or types in an embodiment. It should be noted that other processing is also performed in connection with the first write. In one embodiment, such processing may include receiving from a host the write operation at the data storage system (where the write operation is writing to a chunk of a TD for the first time), storing the write data of the write operation in cache, sending an acknowledgement to the host regarding successful completion of the write operation, allocating storage for the chunk from the highest ranked classification such as SLC, destaging the cached write data to the newly allocated SLC storage of an SLC device, and updating workload information for the SLC classification for the extent including the chunk. The destaging may generally be performed any time after the write data is placed in the data cache as soon as the DA servicing the SLC device upon which storage has been allocated is able to destage the write data.

The foregoing first write operation may be performed at a first point in time such as with respect to a chunk C1 of a first thin device TD1. Chunk C1 may be included in extent E1 of TD1. Subsequent to this first point in time and while data for C1 is stored on SLC, other I/O operations may be directed to C1 (e.g. other I/Os may be directed to a logical address of TD1 included in the subrange of TD1's logical addresses associated with C1). For each such I/O that is read, workload information for E1 may be updated. If the I/O is a write operation, additional processing may be performed that will now be described. The additional processing may also be referred to herein as subsequent write processing that may be performed in connection with each write operation other than the first write operation to a chunk causing its initial storage allocation. The subsequent write processing may include using the workload information for E1 for the SLC classification to determine whether the current SLC classification is suitable for the current workload of the E1 having its data stored on SLC. In this example, assume C1 is the only chunk of E1 having its storage allocated from SLC. Such a determination regarding whether SLC is suitable for E1 may be based on the read-write mixture indicated by the workload information for E1 as maintained for the SLC classification. For example, the read-write mixture for E1 for SLC may be compared to a threshold specifying a maximum percentage of reads that may be indicated by the read-write mixture of E1 on SLC in order for SLC to be deemed suitable for storing chunk C1 of E1. Alternatively, the threshold may specify a minimum percentage of writes that may be indicated by the read-write mixture of E1 on SLC in order SLC to be deemed suitable for storing chunk C1 of E1. If it is determined that the SLC classification is suitable for E1, chunk C1 is left in its current classification of SLC and the associated workload information including read-write mixture updated to reflect the write operation. The foregoing threshold may be any suitable threshold for the particular classification.

If it is determined that the SLC classification is not suitable for E1, the additional processing may include selecting a different classification more suitable for C1 based on the current read-write mixture for E1 on SLC. For example, if the current read-write mixture is 5% writes or 95% reads, cMLC may be selected as the more suitable write endurance classification for C1 since cMLC is preferred to workloads that are all or mostly reads. Processing now continues with allocating storage from cMLC, mapping the newly allocated cMLC storage to the logical addresses of C1 of E1 for TD1, destaging the write data from cache to the newly allocated cMLC storage, and updating workload information for E1 in the cMLC classification to reflect the write operation.

Continuing with the example, assume that subsequent to the second point in time many more I/Os are directed to C1 (of E1 of TD1) stored on cMLC are received where such I/Os are mostly or all writes. Each of the reads may cause updating of workload information as noted above. Each of the writes may cause performing the subsequent write processing as described above. As a result at some third point in time subsequent to the second point in time, one of the write operations directed to C1 stored on cMLC may cause the subsequent write processing to determine that cMLC is no longer suitable for storing C1. For example, the current workload for E1 on cMLC may now be 95% and a determination is made that the current cMLC classification is not suitable for C1 based on E1's current workload. In response, processing is performed to allocate new storage from a second different classification more suitable for the current workload of 95% writes. For example, the selected second classification may be SLC and storage may be allocated from SLC and mapped to C1's logical address subrange of TD1. Subsequently, processing will destage the new write data to the mapped physical storage now allocated from SLC.

Thus, generally, as workload information about a data portion currently stored on physical storage of a first classification such as SLC changes, the particular % read bucket or range of the SLC classification to which the data portion contributes changes. When assessing whether a current classification such as SLC is suitable for workload of the data portion, an embodiment may look at % read bucket into which the data portion falls or the read-write mixture for the extent. For example, it may be that all data portions, such as extents, in the % read range 75% to 100% are unsuitable for the first classification SLC and only data portions having a workload falling into the % read range 0 to 25% are suitable for SLC, as may be specified for a particular embodiment.

An embodiment in accordance with techniques herein may also perform processing in an ongoing manner to assess whether a current flash type or write endurance classification is suitable for a data portion and if not, perform processing to relocate the data portion to a different and more suitable flash type or write endurance classification in a manner similar to that as described above and elsewhere herein. For example, consider an embodiment using a write endurance ranking, from highest to lowest of SLC, MLC cMLC. In this embodiment, only the foregoing 3 ranked flash types are included. Assume that first writes to chunks of one or more TDs are performed and storage for all such chunks is allocated from SLC. At some point in time, a threshold amount of SLC may be consumed and processing may be performed to increase the amount of available SLC. Such processing may include determining which TD extents having chunks of storage allocated from SLC are the best candidates to move from SLC to another target flash type of MLC or cMLC. In this case, the processing performed may examine the histogram or its equivalent in tabular form as illustrated in FIG. 10 to determine ideal candidates for data movement from SLC. Ideal candidates may be determined as those chunks having the most reads, such as all in the 75%-100% read bucket. Extents contributing to the 75-100% read bucket may be ordered, from highest read percentage to lowest read percentage and processing may relocate chunks of such extents having the highest read percentages prior to other extents ranked lower (having a lower read percentage) until a threshold amount of SLC is once again available. Relocating a chunk from a first classification or flash type to a second classification or flash type may include allocating storage for the chunk in the second classification or flash type and mapping the newly allocated storage to the chunks corresponding logical address subrange of the TD including the chunk.

More generally, processing to assess and possibly relocate chunks from a first classification determined as unsuitable to a second more suitable classification may be performed in an ongoing manner and/or responsive to other conditions occurring besides a threshold amount of SLC being consumed.

Thus, techniques herein provide for checking the read-write mixture for an extent including a chunk to which a write is directed where the read-write mixture that is examined is for the flash type where storage for the chunk is currently allocated. Thus, the same extent may have multiple sets of workload information depending on what classifications or flash types from which storage is allocated for chunks in the same extent.

What will now be described are flowcharts summarizing processing steps described above that may be performed in an embodiment in accordance with techniques herein.

Figure 12:
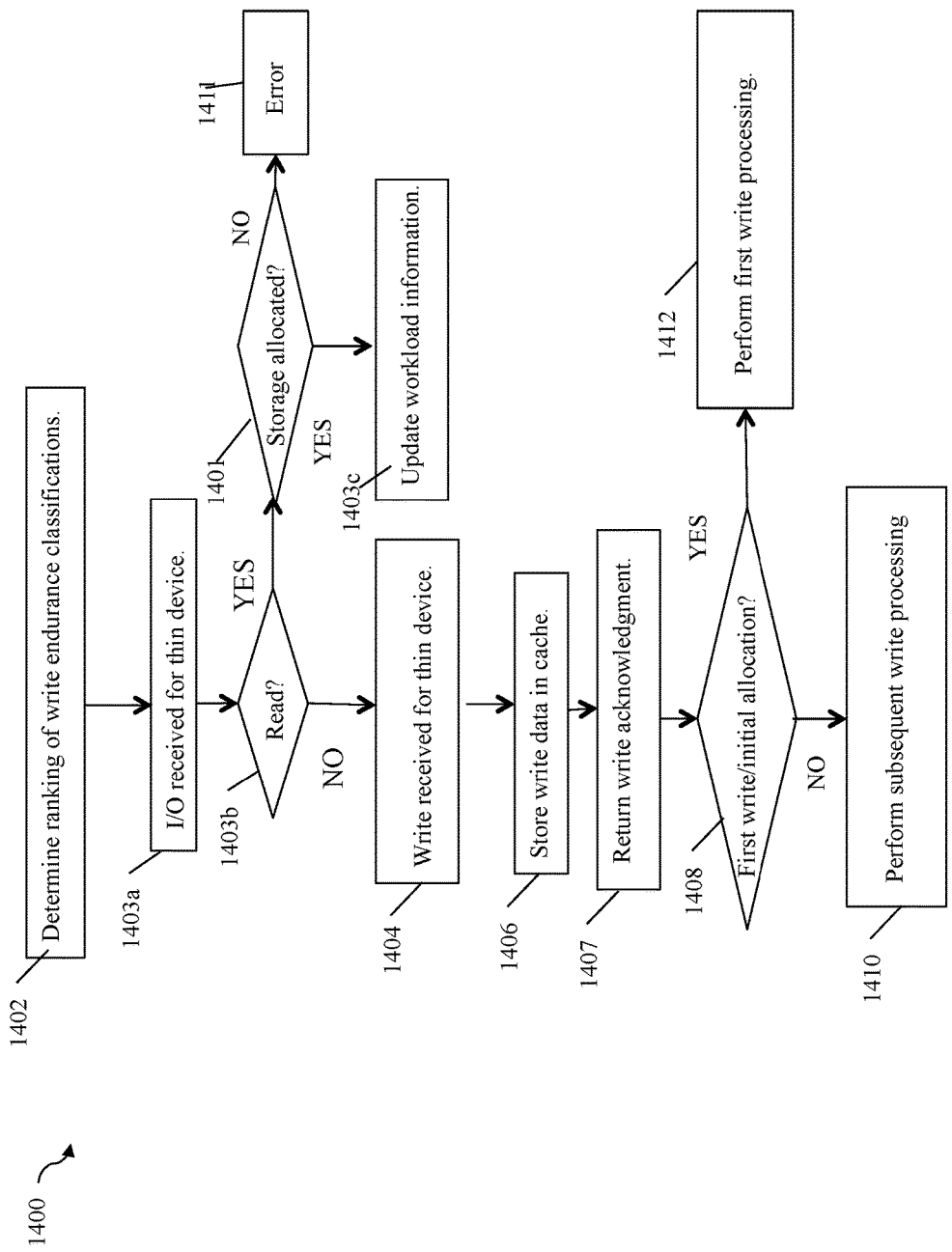
FIGS. 12-15 are flowcharts of processing steps that may be performed in an embodiment in accordance with techniques herein.

Referring to FIG. 12, shown is a first flowchart of processing steps that may be performed in an embodiment in accordance with techniques herein. The flowchart 1400 includes step 1402 where a relative ranking of the write endurance classifications or flash types is determined. As noted above, the ranking may be used to select suitable storage for an initial TD allocation as well as for generally selecting a suitable classification for subsequent storage allocations based on current workload. At step 1403a, an I/O operation directed to a chunk of a thin device may be received. At step 1403b, a determination is made as to whether the I/O is a read operation. If step 1403b determines the I/O operation is a read, control proceeds to step 1401 where a determination is made as to whether storage is currently allocated or mapped to the chunk to which the read is directed. If step 1401 evaluates to no, control proceeds to step 1411 to perform error processing (e.g., data cannot be read from a logical address for which there has been no writing of data and therefore no allocated and mapped physical storage). If step 1401 evaluates to yes, control proceeds to step 1403c where workload information is updated. The chunk may be stored on physical storage of a current flash type or classification and workload information for the current classification for the extent including the chunk to which the read operation is directed may be updated in step 1403c. Otherwise, if step 1403b evaluates to no, control proceeds to step 1404 where it is determined that the I/O is a write received for a thin device. At step 1406, the write data is stored in cache and an acknowledgement regarding the successful completion of the write may be returned in step 1407. In step 1408, a determination is made as to whether this write operation is the first write to the chunk whereby no physical storage is currently mapped to the logical addresses of the thin device's address space corresponding to the chunk. If step 1408 evaluates to yes indicating this is the first write to the chunk, first write processing is performed in step 1412. If step 1408 evaluates to no, subsequent write processing is performed in step 1410.

Figure 13:
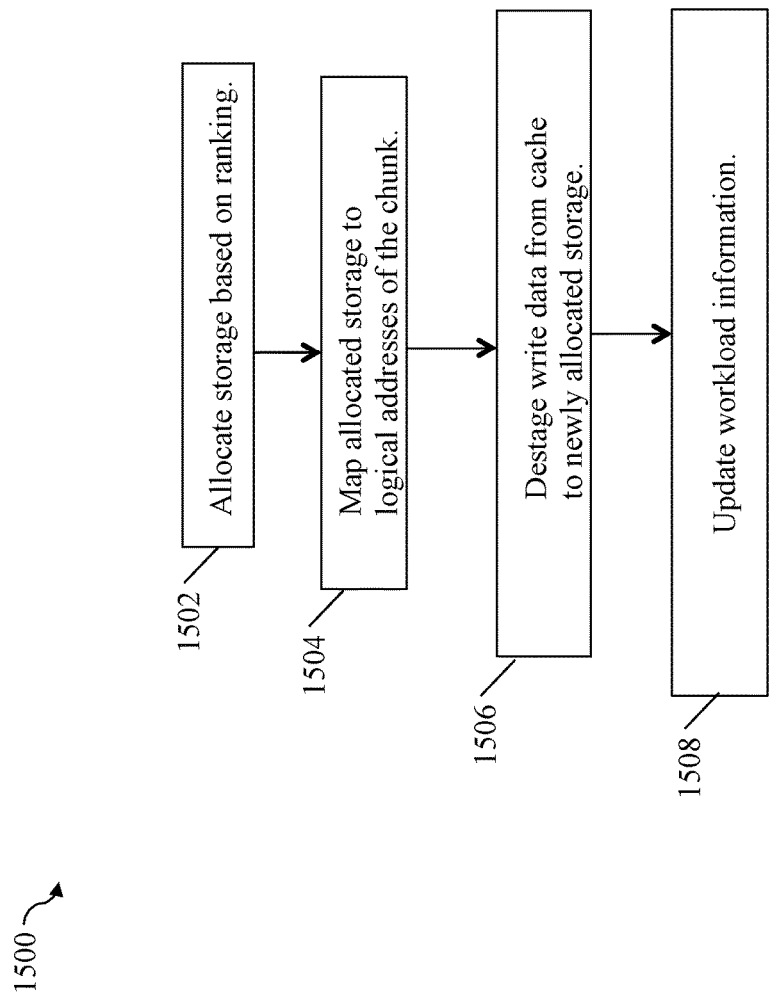

Referring to FIG. 13, shown is a second flowchart of processing steps that may be performed in an embodiment in accordance with techniques herein. The flowchart 1500 provides additional details regarding step 1412. At step 1502, storage is allocated for the chunk from a selected flash type based on the ranking determined in step 1402. For example, storage may be allocated from SLC for the chunk. At step 1504, the allocated storage is mapped to the logical addresses of the chunk. At step 1506, the write data is destaged from cache to the newly allocated storage (as allocated in step 1504). At step 1508, workload information for the selected flash type for the extent including the chunk is updated to reflect the write operation just received.

Figure 14:
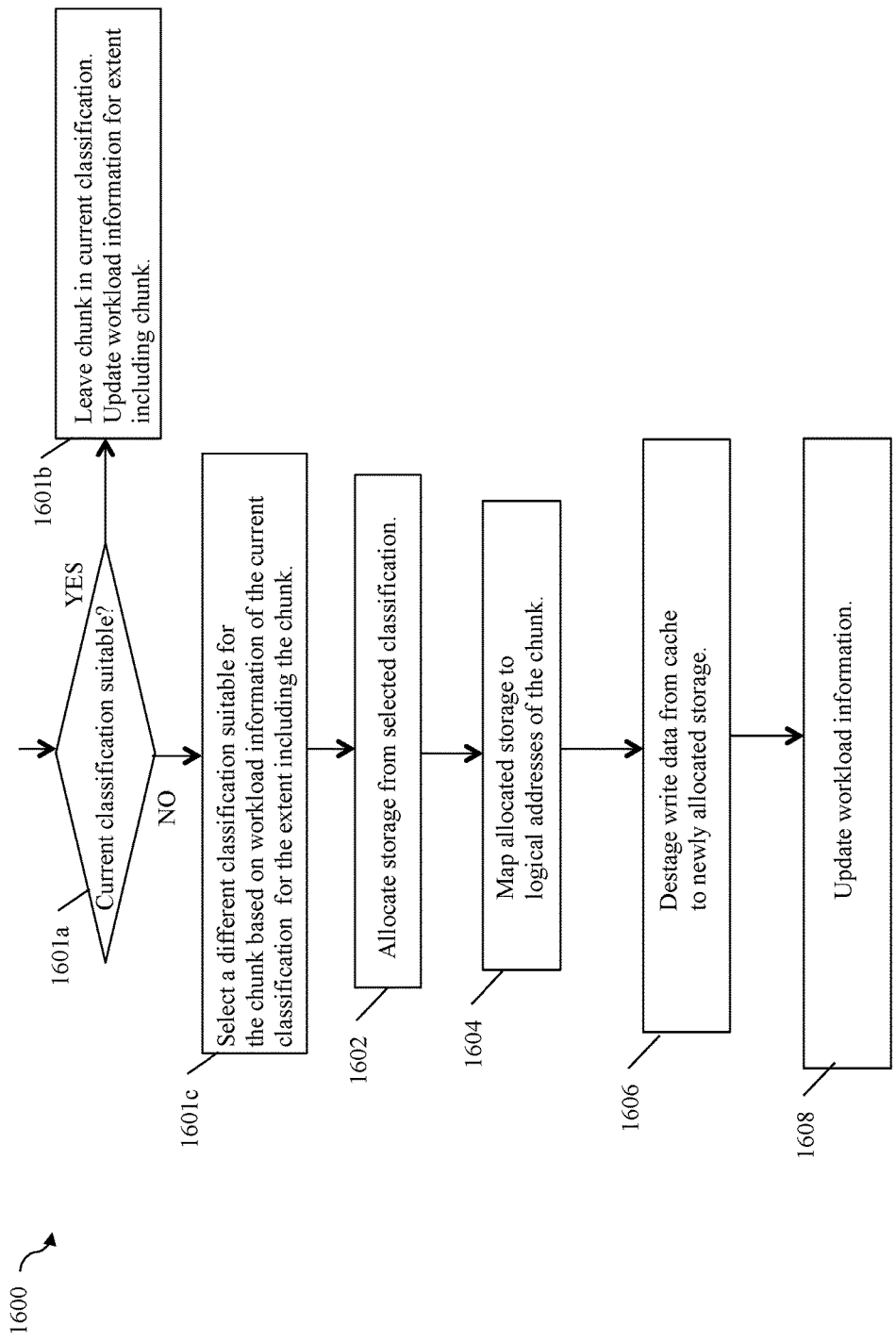

Referring to FIG. 14, shown is a third flowchart of processing steps that may be performed in an embodiment in accordance with techniques herein. The flowchart 1600 provides additional details regarding step 1410. A determination is made at step 1601a as to whether the current classification or flash type of the physical storage where the chunk is currently stored or mapped is suitable based on the read-write mixture of the workload information for the current flash type for the extent including the chunk. If step 1601a evaluates to yes indicating the current classification is suitable for the chunk, control proceeds to step 1601b where the chunk is left is its currently allocated storage and classification and the workload information for the current classification for the extent including the chunk is updated. If step 1601a evaluates to no whereby the current classification is determined not to be suitable for the chunk, control proceeds to step 1601c. At step 1601c, a different classification is selected that is more suitable for the chunk based on workload information (e.g., read-write mixture) of the current classification for the extent including the chunk. At step 1602, storage is allocated from the selected classification determined by step 1601c. At step 1604, the allocated storage of the selected classification is mapped to the logical addresses of the chunk. At step 1606, the write data is destaged from cache to the newly allocated storage of the selected classification (e.g., as allocated in step 1602). At step 1608, workload information for the selected classification for the extent including the chunk is updated to reflect the write operation.

Figure 15:
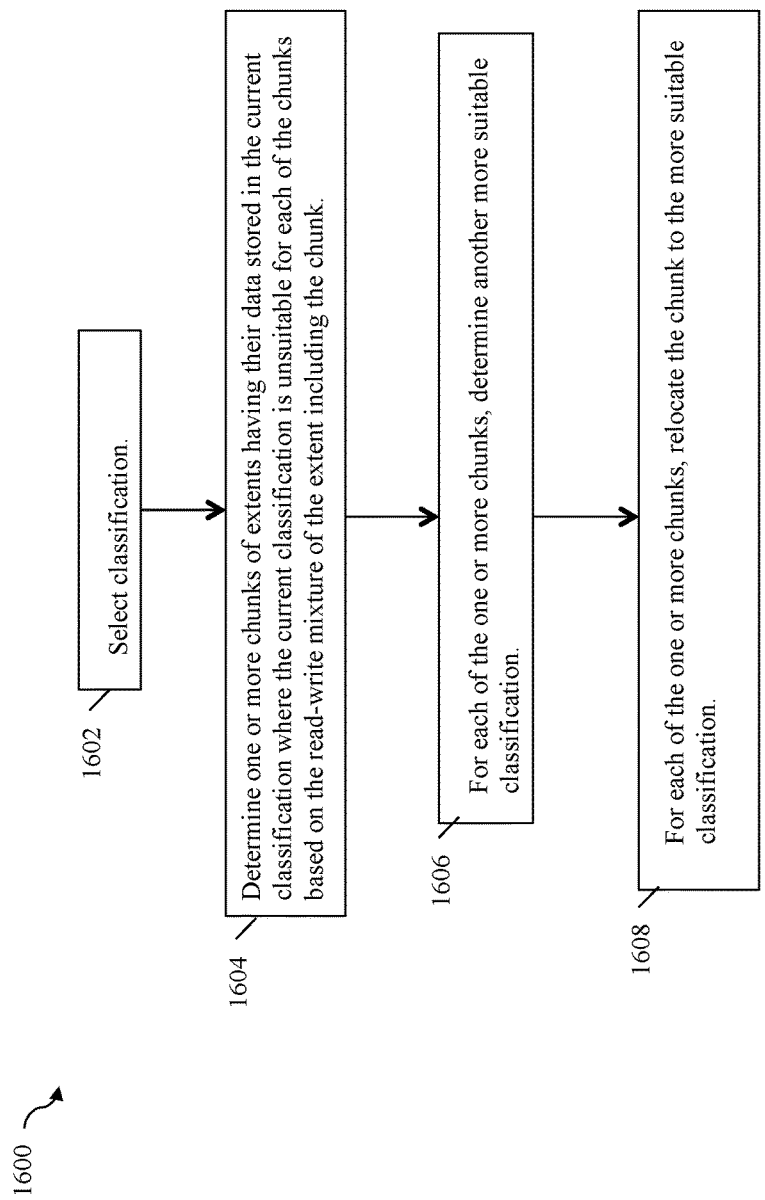

Referring to FIG. 15, shown is a fourth flowchart of processing steps that may be performed in an embodiment in accordance with techniques herein. The flowchart 1600 may be performed in an ongoing manner, responsive to consuming more than a threshold amount of a particular flash type or classification such as SLC or other highest ranked classification, and the like. At step 1602, a classification is selected for which processing is to be performed to determine and relocate data portions having workloads unsuitable for the classification. For example, assume step 1602 selects SLC. At step 1604, for SLC, a set of one or more chunks having their data stored physical storage of the selected classification are determined where the selected SLC classification is determined as unsuitable for each of the chunks based on the read-write mixture of the extent including the chunk. At step 1606, for each of the chunks determined in step 1604, another more suitable classification is determined. At step 1608, for each of the chunks (as determined in step 1604), the chunk is relocated to the more suitable classification (as determined in step 1606). Relocating a chunk from a first classification or flash type to a second classification or flash type may include allocating storage for the chunk in the second classification or flash type and mapping the newly allocated storage to the chunks corresponding logical address subrange of the TD including the chunk.

The techniques herein may be performed by executing code which is stored on any one or more different forms of computer-readable media. Computer-readable media may include different forms of volatile (e.g., RAM) and non-volatile (e.g., ROM, flash memory, magnetic or optical disks, or tape) storage which may be removable or non-removable.

While the invention has been disclosed in connection with preferred embodiments shown and described in detail, their modifications and improvements thereon will become readily apparent to those skilled in the art. Accordingly, the spirit and scope of the present invention should be limited only by the following claims.

What is claimed is:

1. A method of determining physical storage for storing data comprising:
   receiving a ranking of a plurality of write endurance classifications of storage devices, said ranking indicating a relative ordering of expected write endurance of the plurality of write endurance classifications;
   determining, in accordance with first workload information, whether to relocate at least a first chunk of a first data portion currently stored on physical storage of a first of the plurality of write endurance classifications, said first workload information denoting a mixture of read and write operations directed to the first data portion; and responsive to determining to relocate at least the first chunk of the first data portion, performing first processing including:
    selecting, in accordance with the first workload information for the first data portion, a second of the plurality of write endurance classifications; and
    moving at least the first chunk of the first data portion from physical storage of the first write endurance classification to other physical storage of a second of the plurality of write endurance classifications.

2. The method of claim 1, wherein said first write endurance classification is associated with a first range of read/write ratios denoting any of a suitable and preferred workload for data stored on physical storage of the first write endurance classification, and wherein said second write endurance classification is associated with a second range of read/write ratios denoting any of a suitable and preferred workload for data stored on physical storage of the second write endurance classification.

3. The method of claim 2, wherein said determining whether to relocate at least the first chunk of the first data portion further comprises:
    determining whether the first workload information denotes a mixture of read and write operations that is within the first range; and
    responsive to determining that the first workload information does not denote a mixture of read and write operations within the first range, determining to relocate at least the first chunk of the first data portion from physical storage of the first write endurance classification.

4. The method of claim 3, wherein said selecting further comprises:
    determining whether the first workload information denotes a mixture of read and write operations that is within the second range; and
    responsive to determining that the first workload information denotes a mixture of read and write operations within the second range, selecting the second write endurance classification as a target write endurance classification to which at least the first chunk of the first data portion is relocated.

5. The method of claim 1, further comprising:
receiving a write operation directed to the first chunk of the first data portion;
responsive to receiving the write operation, performing second processing including:
    determining whether storage is allocated for the first chunk; and
    responsive to determining that storage is currently allocated for the first chunk, performing said determining whether to relocate the first chunk of the first data portion from the first write endurance classification.

6. The method of claim 1, wherein said plurality of write endurance classifications denote different write endurance classifications of flash memory-based storage devices.

7. The method of claim 6, wherein said plurality of write endurance classifications include any of single level cell (SLC) flash, enterprise multi-level cell (eMLC) flash, multi-level cell (MLC) flash, tri-level cell (TLC) flash, and consumer grade multi-level cell (cMLC).

8. The method of claim 1, wherein each of the plurality of write endurance classifications includes a same amount of storage capacity.

9. The method of claim 8, further comprising:
modifying said ranking in accordance with one or more changes in storage capacity for one or more of the plurality of write endurance classifications.

10. The method of claim 9, further comprising:
determining, for each of the plurality of write endurance classifications, an amount of allowable writes per unit of time based on a storage capacity of said each write endurance classification; and
determining a revised version of said ranking of the plurality of write endurance classifications in accordance with the amount of allowable writes per unit of time based on a storage capacity of each of the plurality of write endurance classifications.

11. The method of claim 1, wherein the first data portion is an extent that includes a plurality of chunks and each of the plurality of chunks is stored on physical storage of a different one of the plurality of write endurance classifications.

12. A system comprising:
one or more processors; and
a memory comprising code stored thereon that, when executed, by one or more processors, performs a method of determining physical storage for storing data comprising:
    receiving a ranking of a plurality of write endurance classifications of storage devices, said ranking indicating a relative ordering of expected write endurance of the plurality of write endurance classifications;
    determining, in accordance with first workload information, whether to relocate at least a first chunk of a first data portion currently stored on physical storage of a first of the plurality of write endurance classifications, said first workload information denoting a mixture of read and write operations directed to the first data portion; and
    responsive to determining to relocate at least the first chunk of the first data portion, performing first processing including:
        selecting, in accordance with the first workload information for the first data portion, a second of the plurality of write endurance classifications; and
        moving at least the first chunk of the first data portion from physical storage of the first write endurance classification to other physical storage of a second of the plurality of write endurance classifications.

13. A non-transitory computer readable medium comprising code stored thereon that, when executed, performs a method of determining physical storage for storing data comprising:
    receiving a ranking of a plurality of write endurance classifications of storage devices, said ranking indicating a relative ordering of expected write endurance of the plurality of write endurance classifications;
    determining, in accordance with first workload information, whether to relocate at least a first chunk of a first data portion currently stored on physical storage of a first of the plurality of write endurance classifications, said first workload information denoting a mixture of read and write operations directed to the first data portion; and
    responsive to determining to relocate at least the first chunk of the first data portion, performing first processing including:

selecting, in accordance with the first workload information for the first data portion, a second of the plurality of write endurance classifications; and moving at least the first chunk of the first data portion from physical storage of the first write endurance classification to other physical storage of a second of the plurality of write endurance classifications.

14. The non-transitory computer readable medium of claim 13, wherein said first write endurance classification is associated with a first range of read/write ratios denoting any of a suitable and preferred workload for data stored on physical storage of the first write endurance classification, and wherein said second write endurance classification is associated with a second range of read/write ratios denoting any of a suitable and preferred workload for data stored on physical storage of the second write endurance classification.

15. The non-transitory computer readable medium of claim 14, wherein said determining whether to relocate at least the first chunk of the first data portion further comprises:

determining whether the first workload information denotes a mixture of read and write operations that is within the first range; and responsive to determining that the first workload information does not denote a mixture of read and write operations within the first range, determining to relocate at least the first chunk of the first data portion from physical storage of the first write endurance classification.

16. The non-transitory computer readable medium of claim 15, wherein said selecting further comprises:

determining whether the first workload information denotes a mixture of read and write operations that is within the second range; and responsive to determining that the first workload information denotes a mixture of read and write operations within the second range, selecting the second write endurance classification as a target write endurance classification to which at least the first chunk of the first data portion is relocated.

17. The non-transitory computer readable medium of claim 13, wherein the method further comprises:

receiving a write operation directed to the first chunk of the first data portion;

responsive to receiving the write operation, performing second processing including:

determining whether storage is allocated for the first chunk; and responsive to determining that storage is currently allocated for the first chunk, performing said determining whether to relocate the first chunk of the first data portion from the first write endurance classification.

18. The non-transitory computer readable medium of claim 13, wherein said plurality of write endurance classifications denote different write endurance classifications of flash memory-based storage devices.

19. The non-transitory computer readable medium of claim 18, wherein said plurality of write endurance classifications include any of single level cell (SLC) flash, enterprise multi-level cell (eMLC) flash, multi-level cell (MLC) flash, tri-level cell (TLC) flash, and consumer grade multi-level cell (cMLC).

20. The non-transitory computer readable medium of claim 13, wherein the first data portion is an extent that includes a plurality of chunks and each of the plurality of chunks is stored on physical storage of a different one of the plurality of write endurance classifications.

* * * * *